US006449746B1

(12) United States Patent
Truong et al.

(10) Patent No.: US 6,449,746 B1
(45) Date of Patent: Sep. 10, 2002

(54) DECODING METHOD FOR CORRECTING BOTH ERASURES AND ERRORS OF REED-SOLOMON CODES

(75) Inventors: Truieu K. Truong, San Marino, CA (US); Jyh H. Jeng, Ta-Hsu Hsiang (TW); Tsen C. Cheng, San Marino, CA (US)

(73) Assignees: T. K. Truong, San Marino, CA (US); T. C. Cheng, San Marino, CA (US)

( * ) Notice: Subject to any disclaimer, the term of this patent is extended or adjusted under 35 U.S.C. 154(b) by 0 days.

(21) Appl. No.: 09/374,796

(22) Filed: Aug. 16, 1999

Related U.S. Application Data

(60) Provisional application No. 60/142,247, filed on Jul. 2, 1999, provisional application No. 60/110,284, filed on Nov. 27, 1998, provisional application No. 60/110,114, filed on Nov. 27, 1998, and provisional application No. 60/096,825, filed on Aug. 17, 1998.

(51) Int. Cl.[7] ............................................. H03M 13/00
(52) U.S. Cl. ...................................... 714/784; 714/785
(58) Field of Search ................................. 714/784, 785

(56) References Cited

U.S. PATENT DOCUMENTS

| | | | | |
|---|---|---|---|---|
| 4,504,948 A | | 3/1985 | Patel ............................ 371/38 |
| 4,782,490 A | | 11/1988 | Tenengolts .................... 371/40 |
| 4,866,716 A | * | 9/1989 | Weng .......................... 714/782 |
| 4,868,828 A | * | 9/1989 | Shao et al. .................. 714/704 |
| 5,107,503 A | * | 4/1992 | Riggle et al. ............... 714/784 |
| 5,185,711 A | | 2/1993 | Hattori ..................... 364/746.1 |
| 5,428,628 A | * | 6/1995 | Hassner et al. ............. 714/759 |
| 5,517,509 A | | 5/1996 | Yoneda ....................... 371/37.1 |
| 5,844,919 A | * | 12/1998 | Glover et al. .............. 714/769 |
| 5,942,005 A | | 8/1999 | Hassner et al. ............. 714/784 |
| 6,119,262 A | * | 9/2000 | Chang et al. ............... 714/781 |

FOREIGN PATENT DOCUMENTS

| | | | | |
|---|---|---|---|---|
| JP | 11274940 A | * | 10/1999 | .......... H03M/13/00 |
| WO | WO 200028668 A1 | * | 5/2000 | .......... H03M/13/15 |

OTHER PUBLICATIONS

Truong, T.K.; Hsu, I.S.; Eastman, W.L. and Reed, I.S.; Reed–Solomon code using Euclidean algorithm; Computers and Digital Techniques, IEE Proceedings E [see also Computers and Digital Techniques, IEE Proceedings–], vol. 135 Issue: 6, Nov. 1988 Page(s).*

Interlando, J.C.; Palazzo, R., Jr. and Elia, M.; On the decoding of Reed–Solomon and BCH codes over integer residue rings; Information Theory, IEEE Transactions on , vol. 43 Issue: 3, May 1997 pp. 1013–1021.*

Reed, I.S. and Shih, M.T.; VLSI design of inverse–free Berlekamp–Massey algorithm; Computers and Digital Techniques, IEE Proceedings E [see also Computers and DigitalTechniques, IEE Proceedings–], vol. 138 Issue: 5, Sep. 1991 pp. 295–298.*

(List continued on next page.)

*Primary Examiner*—Albert Decady
*Assistant Examiner*—Joseph D. Torres
(74) *Attorney, Agent, or Firm*—Christie, Parker & Hale, LLP

(57) ABSTRACT

A highly efficient decoding method is derived to correct both erasures and errors for Reed-Solomon (RS) codes, which takes the advantages of the Euclidean algorithm and the BM algorithm. The new decoding method computes the errata locator polynomial and the errata evaluator polynomial simultaneously without performing the polynomial divisions, and there is no need to compute the discrepancies and the field element inversions. Also, separate computations of the erasure locator polynomial and the Forney syndromes are avoided. Moreover, a simple and fast process for a finite field multiplication and finite field inversion is provided.

15 Claims, 8 Drawing Sheets

OTHER PUBLICATIONS

Fitzpatrick, P.; New time domain errors and erasures decoding algorithm for BCH codes; Electronics Letters, vol. 30 Issue: 2, Jan. 20, 1994 pp. 110–111.*

Xu Youzhi; Implementation of Berlekamp–Massey algorithm without inversion; Communications, Speech and Vision, IEE Proceedings I, vol. 138 Issue: 3, Jun. 1991 pp. 138–140.*

Rsie–Chia Chang; Shung, C.B.; A (208,192;8) Reed–Solomon decoder for DVD application; Dept. of Electron. Eng., Nat. Chiao Tung Univ., Hsinchu, Taiwan; This paper appears in: Communications, 1998. ICC 98. Conference Record. 1998 IEEE International Conferenc.*

Trieu–Kien Truong; Jeng, J.H. and King–Chu Hung; Inversionless decoding of both errors and erasures of Reed–Solomon code; Communications, IEEE Transactions on, vol. 46 Issue: 8. Aug. 1998 pp. 973–976.*

Sorger, U.K.; A new Reed–Solomon code decoding algorithm based on Newton's interpolation; Information Theory, IEEE Transactions on, vol. 39 Issue: 2, Mar. 1993 pp. 358–365.*

Fleischmann, M.; Modified Berlekamp–Massey algorithm for two–sided shift–register synthesis Electronics Letters, vol. 31 Issue: 8, Apr. 13, 1995 pp. 605–606.*

Eastman, Willard L., "Euclideanization of the Berlekamp–Massey Algorithm" Proceedings of the 1988 Tactical Communications Conference, vol. 1 (1988), pp. 295–303.

Youzhi, X., "Implementation of Berlekamp–Massey algorithm without inversion" IEE Proceedings I Communications, Speech and Vision, vol. 138, No. 3, Jun. 1991.

Schmidt, M. et al., "Fast inversion of Hankel systems and efficient BCH decoding", Proceedings of 1997 IEEE International Symposium on Information Theory, Jun. 29–Jul. 4, 1997.

Truong, T.K. et al., "Simplified procedure for correcting both errors and erasures of Reed–Solomon code using Eucludean algorithm", IEE Proceedings Computers and Digital Techniques, vol. 135, Pt. E, No. 6, Nov. 1988.

Truong, T.K. et al., "Inversionless decoding of both errors and erasures or Reed Solomon code", IEEE Transactions on Communications, vol. 46, No. 8, Aug. 1998.

International Preliminary Examination Report, International Application No. PCT/US99/18859, May 30, 2000, 4 pages.*

* cited by examiner

US 6,449,746 B1

DECODING METHOD FOR CORRECTING BOTH ERASURES AND ERRORS OF REED-SOLOMON CODES

CROSS REFERENCE TO RELATED APPLICATIONS

This application claims priority to the following applications: provisional Application No. 60/096,825, filed Aug. 17, 1998, entitled "Decoder For Correcting Errors of Reed-Solomon Codes"; Provisional Application No. 60/110,114, filed Nov. 27, 1998, entitled "Decoding Algorithm For Correcting Both Erasures And Errors of Reed-Solomon Codes"; Provisional Application No. 60/110,284, filed Nov. 27, 1998, entitled "New Decoding Algorithm For Correcting Both Erasures And Errors of Reed-Solomon Codes"; and provisional Application No. 60/142,247, filed Jul. 2, 1999, entitled "Decoding Method For Correcting Both Erasures And Errors of Reed-Solomon Codes." The above-identified applications being incorporated by reference as if fully set forth herein.

FIELD OF INVENTION

The present invention relates generally to forward error correcting (FEC) methodology. The present invention relates more particularly to a method for decoding Reed-Solomon (RS) encoded data for correcting erasures and errors in a manner which is computationally efficient and which is suited for very large scale integrated circuit (VLSI) implementation.

BACKGROUND OF THE INVENTION

As data storage densities and data transmission rates increase, the ability of hardware devices to correctly recognize binary data diminishes. Such binary data, which comprises a string of bits, i.e., zeros and ones, must be correctly recognized so as to facilitate the proper interpretation of the information represented thereby. That is, each individual zero and one needs to be interpreted reliably, so as to facilitate the accurate reconstruction of the stored and/or transmitted data represented thereby.

Such increased storage densities and transmission rates place a heavy burden upon the hardware utilized to recognize the state of individual bits. In contemporary storage devices, high storage densities dictate that the individual data bits be stored very close to one another. Further, in some data storage systems, the difference between the manner in which a one and a zero is stored in the media is not great enough to make the reading thereof as reliable as desired.

High data transmission rates imply either that the time allocated for each bit is substantially reduced, or that a modulation scheme is utilized wherein small differences in amplitude, frequency, and/or phase indicate a distinct sequence of bits, e.g., such as in multi-bit modulation. In either instance, the ability of hardware devices to accurately and reliably interpret such transmitted data is substantially reduced.

As those skilled in the art will appreciate, increasing data storage density and/or increasing data transmission speed inherently increases the bit error rate, i.e., the percentage of error bits contained in a message. It is desirable to be able to identify and correct data errors which occur during data storage and/or transmission operations. By being able to identify and correct such data errors, data may be stored more densely and/or transmitted more rapidly. Moreover, the ability to correct errors facilitates storage and transmission of data in environments with low signal to noise ratios. Thus, more noise can be tolerated within a storage and transmission medium.

Encoding is performed by an encoder before the data is transmitted (or stored). Once the transmitted data is received at the receiver end, a decoder decodes the data and corrects any correctable errors. Many encoders first break the message into a sequence of elementary blocks; next they substitute for each block a representative code, or signal, suitable for input to the channel. Such encoders are called block encoders. The operation of a block encoder may be described completely by a function or table showing, for each possible block, the code that represents it.

Error-correcting codes for binary channels that are constructed by algebraic techniques involving linear vector spaces or groups are called algebraic codes. Any binary code contains a number of code words which may be regarded as vectors $C=(c1, c2, \ldots, cn)$ of binary digits ci. The sum $C+C'$ of two vectors may be defined to be the vector $(c1+c'1, \ldots, cn+c'n)$ in which coordinates of C and C' are added in modulo 2.

Thus, the vector sum of any two code words is also a code word. Because of that, these codes are linear vector spaces and groups under vector addition. Their code words also belong to the n-dimensional space consisting of all $2^n$ vectors of n binary coordinates. Consequently, the coordinates ci must satisfy certain linear homogeneous equations. The sums in such equations are performed in modulo 2. In general, any r linearly independent parity check equations in $c1, \ldots, cn$ determine a linear subspace of dimension $k=n-r$. The $2^k$ vectors in this subspace are the code words of a linear code.

The r parity checks may be transformed into a form which simplifies the encoding. This transformation consists of solving the original parity check equations for some r of the coordinates ci as expressions in which only the remaining n−r coordinates appear as independent variables. The k=n−r independent variables are called message digits because the $2^k$ values of these coordinates may be used to represent the letters of the message alphabet. The r dependent coordinates, called check digits, are then easily computed by circuits which perform modulo 2 multiplications and additions.

At the receiver the decoder can also do modulo 2 multiplications and additions to test if the received digits still satisfy the parity check equations. The set of parity check equations that fail is called the "syndrome" because it contains the data that the decoder needs to diagnose the errors. The syndrome depends only on the error locations, not on which code word was sent. In general, a code can be used to correct e errors if each pair of distinct code words differ in at least 2e+1 of the n coordinates. For a linear code, that is equivalent to requiring the smallest number d of "ones" among the coordinates of any code word [excepting the zero word $(0, 0, \ldots, 0)$] to be 2e+1 or more. Under these conditions each pattern of $0, 1, \ldots, e-1$, or e errors produces a distinct syndrome; the decoder can then compute the error locations from the syndrome. This computation may offer some difficulty, but at least, it involves only 2e binary variables, representing the syndrome, instead of all n coordinates.

The well known RS encoding methodology provides an efficient means of error detection which also facilitates forward error correction, wherein a comparatively large number of data errors in stored and/or transmitted data can be corrected. RS encoding is particularly well suited for correcting burst errors, wherein a plurality of consecutive bits become corrupted. RS encoding is an algebraic block encoding and is based upon the arithmetic of finite fields. A basic definition of RS encoding states that encoding is performed by mapping from a vector space of M over a finite field K into a vector space of higher dimension over the same field. Essentially, this means that with a given character set, redundant characters are utilized to represent the original data in a manner which facilitates reconstruction of the original data when a number of the characters have become corrupted.

This may be better understood by visualizing RS code as specifying a polynomial which defines a smooth curve containing a large number of points. The polynomial and its associated curve represent the message. That is, points upon the curve are analogous to data points. A corrupted bit is analogous to a point that is not on the curve, and therefore is easily recognized as bad. It can thus be appreciated that a large number of such bad points may be present in such a curve without preventing accurate reconstruction of the proper curve (that is, the desired message). Of course, for this to be true, the curve must be defined by a larger number of points than are mathematically required to define the curve, so as to provide the necessary redundancy. If N is the number of elements in the character set of the RS code, then the RS encode is capable of correcting a maximum of t errors, as long as the message length is equal to N−2t.

Although the use of RS encoding provides substantial benefits by enhancing the reliability with which data may be stored or transmitted, the use of RS encoding according to contemporary practice possesses inherent deficiencies. These deficiencies are associated with the decoding of RS encoded data. It should be noted that in many applications, the encoding process is less critical than the decoding process. For example, since CDs are encoded only once, during the mastering process, and subsequently decoded many times by users, the encoding process can use slower, more complex and expensive technology. However, decoding must be performed rapidly to facilitate real-time use of the data, e.g., music, programs, etc., and must use devices which are cost competitive in the consumer electronics market. DVDs and Digital Televisions also extensively use RS decoding to correct any errors in the incoming signals. Additionally, DVDs use RS decoding to correct erasures in the incoming signals. Because of the high data rate in these applications, the rate and efficiency of RS decoding implementations become very crucial. More applications of the RS codes are described in S. B. Wicker and V. K. Bhargava, *Reed-Solomon codes and their application*, New York: IEEE Press, 1994, and C. Basile et al., "The U.S. HDTV standard the grand," *IEEE Spectrum*, vol. 32, pp. 36–45, April 1995 the contents of which are hereby incorporated by reference.

Decoding RS encoded data involves the calculation of an error locator polynomial and an error evaluator polynomial. The error locator polynomial provides information about the location of errors in the received vector. One of two methods is typically utilized to decode RS encoded data. The Berlekamp-Massey (BM) algorithm described in E. R. Berlekamp, *Algebraic coding theory*, New York: McGraw-Hill, 1968, the content of which is hereby incorporated by reference, is the best known technique for finding the error locator. The BM algorithm is capable of being implemented in a VLSI chip. However, the BM algorithm utilizes an inversion process which undesirably increases the complexity of such a VLSI design and which is computationally intensive, thereby undesirably decreasing the speed of decoding process. Also well known is the use of Euclid's algorithm for the decoding of RS encoded data. However, Euclid's algorithm utilizes a polynomial division methodology which is also computationally intensive. A simplified Euclidean algorithm is defined in T. K. Truong, W. L. Eastman, I. S. Reed, and I. S. Hsu, "Simplified procedure for correcting both errors and erasures of Reed-Solomon code using Euclidean algorithm," *Proc. Inst. Elect. Eng.*, vol. 135, pt. E, pp. 318–324, November 1988, the content of which is hereby incorporated by reference.

In view of the foregoing, it is desirable to provide a method for correcting both errors and erasures, in transmitted data stored in a computer memory, using RS encoding by simultaneously computing an errata locator polynomial and an errata evaluator polynomial without performing polynomial division, without computing the discrepancies, and without inversion; and without a separate computation of an erasure polynomial and the Forney syndrome. This results in a VLSI implementation that is both faster and simpler. It is also desirable to provide a simple multiplication and a simple inversion process for simple and fast VLSI implementations. In addition to decoding RS encoded data, the multiplication and inversion processes can be used for data communication, data encryption and decryption, data compression and decompression, and many other data transformation processes that use multiplication and/or inversion.

SUMMARY OF THE INVENTION

The present invention specifically addresses and alleviates the above mentioned deficiencies associated with the prior art. More particularly, the present invention comprises a highly efficient decoding method to correct both erasures and errors for RS codes, which takes the advantages of Euclidean algorithm and BM algorithm. The procedure for correcting both errors and erasures involves calculating an error-erasure locator polynomial and calculating an error-erasure evaluator polynomial. These polynomials are called errata evaluator and errata locator polynomial hereinafter, respectively.

The new decoding method computes the errata locator polynomial and the errata evaluator polynomial simultaneously without performing the polynomial divisions, and there is no need to compute the discrepancies and the field element inversions. Also, separate computations of the erasure locator polynomial and the Forney syndromes are avoided. Thus for the VLSI implementation, the complexity and the processing time of this new decoding method are dramatically reduced. The method of the present invention takes advantage of certain desirable features of Euclid's algorithm and of the BM algorithm.

According to the present invention, the errata locator polynomial and the errata evaluator polynomial for both erasures and errors are calculated simultaneously and there is no need to perform polynomial divisions within the reiteration process. Further, the need to compute the discrepancies and to perform the field element inversions, as required by the prior art, is eliminated. Thus, the duration of the processing time is substantially shortened.

More particularly, the present invention utilizes an iteration process similar to that of Euclid's algorithm. According to the present invention, field element inversion computations are eliminated as well. According to the present invention, the errata evaluator polynomial is computed simultaneously with the errata locator polynomial. Further simplifying computation, polynomial swaps are avoided. Thus, the decoding method of the present invention for correcting both erasures and errors takes substantially less computations and time, as compared to contemporary algorithms such as Euclid's algorithm and the BM algorithm. Furthermore, the present invention utilizes a simple multiplication process and a simple inversion process for simple and fast VLSI implementations.

The method for correcting erasures and errors in RS encoded data of the present invention can be practiced using either a computer or dedicated circuits, e.g., a VLSI implementation. These, as well as other advantages of the present invention will be more apparent from the following description and drawings. It is understood that changes in the specific structure shown and described may be made within the scope of the claims without departing from the spirit of the invention.

DESCRIPTION

Figure 1:
FIG. 1 is a block diagram of a digital communication system.

Forward error correction (FEC) is a method of error control that employs the adding of systematic redundancy at the transmit end of a link such that errors caused by the medium can be corrected at the receiver by means of a decoding algorithm. FIG. 1 shows a digital communication system with FEC. The binary data source generates information bits at $R_s$ bits per second. These information bits are encoded for FEC at a code rate R. The output of the encoder is a binary sequence at $R_c$ symbols per second. This output is related to the bit rate by the following expression: $R_c = R_s/R$.

Where, code rate R is the ratio of information bits to the number of encoded symbols for binary transmission. For example, if the information bit rate were 2400 bps and code rate were ½, then the symbol ($R_c$) would be 4800 bits per second. The encoder output sequence is then modulated and transmitted over the transmission medium or channel. Demodulation is then performed at the receive end. The output of the demodulator is $R_c$ symbols per second, which is fed to the decoder. The decoder output to the data sink is the recovered 2400 bits per second ($R_s$).

A channel erasure is an error for which the position of the error is known but the magnitude is not. An erasure in position i of a received n-tuple can occur as a result of the decoder receiving insufficient information to decide on a symbol for that coordinate, or information indicating that a particular value is unreliable. Then, the task of the decoder would be to restore or "fill" the erasure positions. A code C is said to correct s erasures if any received vector with 1 s erasures is correctable.

A RS algorithm for correcting both erasures and errors can be used to reduce the signal to noise ratio in a space communication link, a compact-disc (CD) audio system, a HDTV, a digital versatile disc (DVD), and networking communications. The BM algorithm and the Euclidean algorithm can be used to solve Berlekamp's key equation for decoding RS codes.

In the Euclidean algorithm, a syndrome vector s, contains information on the occurrence of errors, their magnitudes and positions. The syndrome is then used by the Euclidean algorithm which determines the positions and magnitudes of the errors. A Chien search is then carried out to complete the error correction. The error locator polynomial and the error evaluator polynomial can be computed simultaneously, but that is less efficient in practice because polynomial divisions are required in the iteration process.

Also, the BM algorithm is the best known technique for finding the error locator polynomial and it can be easily implemented in a VLSI chip. But, it is somewhat hard to understand the intrinsic properties. In the iteration, the discrepancy computation, the items to be updated and the field element inversion still cause much of complexity in the VLSI design. Also, one has to save the syndrome polynomial until the errata locator polynomial is obtained, then perform polynomial multiplication to obtain the errata evaluator polynomial.

A new method which is based on both the Euclidean algorithm and the inverse-free BM algorithm is disclosed. In each iteration, the new method takes the form similar to the Euclidean algorithm and uses the process of the BM algorithm to perform the polynomial divisions. In comparison to the Euclidean algorithm, the errata locator polynomial and the errata evaluator polynomials are computed simultaneously while the polynomial divisions are avoided. In comparison to BM algorithm, the discrepancy and field element inversion computations are eliminated. Also the number of the items to be updated is reduced. Moreover, as an error decoder, there is no separate computations of the erasure locator polynomial and the Forney syndromes. Thus the method is much easier to be implemented in a VLSI chip than that of all the other methods.

Time Domain Decoding Algorithm for Correcting Errors

In the encoding process, a k symbol information vector is mapped onto an n symbol codeword. Thus there are n–k redundant symbols, which help in detecting the occurrence of errors and also in correcting the errors up to a certain limit. Each of these symbols consists of m bits. For an RS code, $n=2^m-1$. An error correction code has a certain error-correction capability defined by t where t is given by $t=(n-k)/2$. An (n.k) RS code is said to be a t error correcting code if it can correct a maximum of t symbol errors occurring during transmission. RS codes have random as well as burst error-correction capabilities. A t symbol error correcting RS code can correct a 2t long burst bit error.

First let n be the block length of an (n,k) RS code over $GF(2^m)$, where $n=2^m-1$ and k is the number of m-bit message symbols. The minimum distance d of this RS code is related to n and k by $d=n-k+1$. It is known that d−1 is the number of parity symbols added, and $t=\lfloor (d-1)/2 \rfloor$ denotes the maximum number of errors can be corrected, where $\lfloor x \rfloor$ denotes the greatest integer less than or equal to x. Let $c=(c_{n-1}, c_{n-2}, \ldots, c_0)$ be the codeword vector to be transmitted and $r=(r_{n-1}, r_{n-2}, \ldots, r_0)$ be the received vector noised by v errors with $0 \le 2v \le d-1$. Also let $e=(e_{n-1}, e_{n-2}, \ldots, e_0)$ denote the error vector. Then, the received vector r is given by $r=c+e$.

Let $\alpha$ be a primitive element in $GF(2^m)$. Since c is a codeword, the syndromes computed from the received vector r can be expressed as $$S_k = \sum_{i=0}^{n-1} r_i \alpha^{ik} = \sum_{i=0}^{n-1} e_i \alpha^{ik} \equiv \sum_{i=1}^{v} Y_i X_i^k \text{ for } 1 \le k \le d-1 \quad (1)$$

where $X_i$ and $Y_i$ are the $i^{th}$ error amplitude and the $i^{th}$ error location, respectively, and $0 \le v \le t$.

The syndrome polynomial is thus can be expressed as $$S(x) = \sum_{k=1}^{d-1} S_k x^k = \sum_{k=1}^{d-1} \left( \sum_{i=1}^{v} Y_i X_i^k \right) x^k \quad (2)$$

$$= \sum_{i=1}^{v} Y_i \frac{X_i x + (X_i x)^d}{1 + X_i x} \equiv \sum_{i=1}^{v} Y_i \frac{X_i x}{1 - X_i x} \bmod x^d$$

Let $\Lambda(x)$ be the error locator polynomial with zeros at the inverse error locations, i.e., $$\Lambda(x) = \prod_{j=1}^{v} (1 + X_j x) = \sum_{j=0}^{v} \Lambda_j x^j \quad (3)$$

where $\Lambda_0 = 1$. Finally, let the error evaluator polynomial be defined by $$\Omega(x) = \sum_{i=1}^{v} Y_i X_i x \prod_{l \ne i} (1 + X_l x) = \sum_{j=1}^{v} \Omega_j x^j$$

where $\deg\{\Omega(x)\} = v$ and $\Omega(0) = 0$. Together with (3), the equation (2) becomes $$S(x) \equiv \frac{\Omega(x)}{\Lambda(x)} \bmod x^d$$

Thus, the Berlekamp's key equation is given by:

$$\Omega(x) \equiv S(x)\Lambda(x) \bmod x^d, \quad (4)$$

and following Forney's algorithm, the error magnitudes can be computed as:

$$Y_l = \frac{\Omega(X_l^{-1})}{\prod_{j \ne l}(1 - X_j X_l^{-1})} = \frac{\Omega(X_l^{-1})}{X_l^{-1} \Lambda'(X_l^{-1})} \text{ for } 1 \le l \le v \quad (5)$$

Now, the essential problem of the decoding process is to compute the error locator polynomial $\Lambda(x)$ and the error evaluator polynomial $\Omega(x)$. It should be noted that the equations (4) and (5) are invariant under the scalar multiplication $\Omega(x) \leftarrow \beta \cdot \Omega(x)$ and $\Lambda(x) \leftarrow \beta \cdot \Lambda(x)$, for any $\beta \in GF(2^m)$. Thus $\Omega(x)$ and $\Lambda(x)$ can be computed up to scalar multiplication of the same factor, i.e., the condition $\Lambda(0) = 1$ is not required.

BM Algorithm for Correcting Errors

It is well known that the BM algorithm can be used to solve the error locator polynomial directly from the equations (1) and (3) which are equivalent to the matrix equation $$\begin{bmatrix} S_1 & S_2 & \cdots & S_v \\ S_2 & S_3 & \cdots & S_{v+1} \\ \vdots & & & \vdots \\ S_v & S_{v+1} & \cdots & S_{2v-1} \end{bmatrix} \begin{bmatrix} \Lambda_v \\ \vdots \\ \Lambda_2 \\ \Lambda_1 \end{bmatrix} = \begin{bmatrix} -S_{v+1} \\ -S_{v+2} \\ \vdots \\ -S_{2v} \end{bmatrix} \quad (6)$$

Equation (6) is the Newton's identities in the matrix form. The process is based on the idea of auto-regressive filter which is implemented as a linear feedback shift register. As long as $\Lambda(x)$ is computed, one substitutes it into (4) to obtain the error evaluator polynomial $\Omega(x)$.

There are many simplified implementations for the BM algorithm. One of the improved BM algorithm is given as follows for later use, which is called an inverse-free BM algorithm for computing $\Lambda(x)$ for correcting both erasures and errors. Since only errors will be discussed first, the Forney syndromes $T_k$ will be replaced by the syndromes $S_k$ later. In the algorithm, k denotes the iteration counter, l denotes the register length and $\delta$ denotes the discrepancy. At the end of the algorithm, $\mu^{(d-1)}(x)$ is the error locator polynomial.

1. Initially define $\mu^{(0)}(x)=1$, $\lambda^{(0)}(x)=1$, $l^{(0)}=0$, k=0 and $\gamma^{(k)}=1$ if $k \le 0$ 2. Set k=k+1. If $T_k$ is unknown, stop. Otherwise, compute $$\delta^{(k)} = \sum_{j=0}^{l^{(k-1)}} \mu_j^{(k-1)} T_{k-j} \quad (7)$$

$$\mu^{(k)}(x) = \gamma^{(k-1)} \mu^{(k-1)}(x) - \delta^{(k)} \lambda^{(k-1)}(x) x \quad (8)$$

$$\lambda^{(k)}(x) = \begin{cases} x \cdot \lambda^{(k-1)}(x), & \text{if } \delta^{(k)} = 0 \text{ or if } 2l^{(k-1)} > k-1 \\ \mu^{(k-1)}(x), & \text{if } \delta^{(k)} \ne 0 \text{ and } 2l^{(k-1)} \le k-1 \end{cases} \quad (9)$$

$$l^{(k)}(x) = \begin{cases} l^{(k-1)}, & \text{if } \delta^{(k)} = 0 \text{ or if } 2l^{(k-1)} > k-1 \\ k - l^{(k-1)}, & \text{if } \delta^{(k)} \ne 0 \text{ and } 2l^{(k-1)} \le k-1 \end{cases} \quad (10)$$

$$\gamma^{(k)} = \begin{cases} \gamma^{(k-1)}, & \text{if } \delta^{(k)} = 0 \text{ or if } 2l^{(k-1)} > k-1 \\ \delta^{(k)}, & \text{if } \delta^{(k)} \ne 0 \text{ and } 2l^{(k-1)} \le k-1 \end{cases} \quad (11)$$

1. Return to step 2.

Euclidean Algorithm for Correcting Errors

In the Euclidean algorithm, one converts the equation (4) into the form $$\Omega(x) = \Theta(x) \cdot x^d + \Lambda(x) \cdot S(x) \quad (12)$$

where $\Theta(x)$ serves as an auxiliary polynomial which is not actually computed in the algorithm.

To investigate the relation of the equation (6) and (12), (6) is re-expressed as $$\begin{bmatrix} S_1 & S_2 & \cdots & S_{v+1} \\ S_2 & S_3 & \cdots & S_{v+2} \\ \vdots & & & \vdots \\ S_{v+1} & S_{v+2} & \cdots & S_{2v} \end{bmatrix} \begin{bmatrix} \Lambda_v \\ \vdots \\ \Lambda_1 \\ 1 \end{bmatrix} = \begin{bmatrix} 0 \\ 0 \\ \vdots \\ 0 \end{bmatrix} \quad (13)$$

which is actually in the form of polynomial multiplication $S(x) \cdot \Lambda(x)$ such that all the coefficients of order higher than $v$ are zero. Thus, to solve $\Lambda(x)$ from (6) and compute $\Omega(x)$ from (4) is equivalent to solve the equation (12) for $\Omega(x)$ and $\Lambda(x)$ simultaneously satisfying the conditions $$\deg\{\Omega(x)\} \le t \text{ and } \deg\{\Lambda(x)\} \le t \quad (14)$$

Hence, the Euclidean algorithm can be applied to perform the polynomial divisions iteratively on $x^d$ and $S(x)$ to determine $\Omega(x)$ and $\Lambda(x)$ in (12).

The New Decoding Method for Correcting Errors (Part I)

The new decoding method uses the equations of the form (12) in the Euclidean algorithm and performs linear combinations on these equations iteratively to obtain new equations which are the same form of (12). The combination is to force some of the coefficients of $\Omega(x)$ to vanish so that $\deg\{\Omega(x)\} \leq t$, which is similar to the BM algorithm. And finally, one obtains an equation of the form (12) satisfying the conditions (14).

To adapt the new notation in (12), the inverse-free BM algorithm illustrated in section III will be modified subject to the following comments (a) to (e).

(a) The Forney syndrome $T_{k-j}$ in (7) is replaced by the syndrome $S_{k-j}$ for correcting errors only.

(b) Combine the "if" part and "else" part of (9), (10) and (11).

(c) The assignment $\lambda^{(k-1)}(x) \leftarrow x\lambda^{(k-1)}(x)$ is inserted before (7).

(d) Remove the superscripts of l, $\gamma$ and $\delta$.

(e) Replace $\lambda^{(k-1)}(x)$ by $\Lambda^{(a)}(x)$, $\mu^{(k-1)}(x)$ by $\Lambda^{(b)}(x)$ and $\mu^{(k)}(x)$ by $\Lambda^{(c)}(x)$, respectively.

By (a), (b) and (c), the new method can be re-expressed as

2. Initially define $\mu^{(0)}(x)=1$, $\lambda^{(0)}(x)=1$, $l^{(0)}=0$, $k=0$ and $\gamma^{(k)}=1$ if $k \leq 0$ 3. Set $k=k+1$. If $k \geq d$, then stop. Otherwise, compute (1). $\gamma^{(k-1)}(x) \leftarrow x\gamma^{(k-1)}(x)$ (15)

(2).

$$\delta^{(k)} = \sum_{j=0}^{l^{(k-1)}} \mu_j^{(k-1)} S_{k-j}$$ (16)

(3). $\mu^{(k)}(x) = \gamma^{(k-1)} \mu^{(k-1)}(x) - \delta^{(k-1)} \gamma^{(k-1)}(x)$ (17)

(4). If $\delta^{(k)} \neq 0$ and $2l^{(k-1)} \leq k-1$ then $\lambda^{(k)}(x) = \mu^{(k-1)}(x)$, $l^{(k)}(x) = k - l^{(k-1)}$ and $\gamma^{(k)} = \delta^{(k)}$ (18)

else $\lambda^{(k)}(x) = \lambda^{(k-1)}(x)$, $l^{(k)} = l^{(k-1)}$ and $\gamma^{(k)} = \gamma^{(k-1)}$ (19)

2. Return to step 2.

By (d) and (e), the three equations in (19) are removed since $\lambda(x)$, l and $\gamma$ remain unchanged for the next iteration. The method is now re-expressed as 1. Initially define $\Lambda^{(b)}(x)=1$, $\Lambda^{(a)}(x)=1$, $l=0$, $k=0$ and $\gamma=1$.

2. Set $k=k+1$. If $k \geq d$, then stop. Otherwise, compute (1). $\Lambda^{(a)}(x) \leftarrow x\Lambda^{(a)}(x)$ (20)

(2).

$$\delta = \sum_{j=0}^{l} \Lambda_j^{(b)} S_{k-j}$$ (21)

(3). $\Lambda^{(c)}(x) = \gamma \Lambda^{(b)}(x) - \delta \Lambda^{(a)}(x)$ (22)

(4). If $\delta \neq 0$ and $2l \leq k-1$ then $\Lambda^{(a)}(x) = \Lambda^{(b)}(x)$, $l = k-l$ and $\gamma = \delta$ (23)

(5). $\Lambda^{(b)}(x) = \Lambda^{(c)}(x)$ (24)

3. Return to step 2.

Here, because k is incremented for the next iteration, the term $\mu^{(k)}(x)$ is automatically updated, thus one needs the additional equation (24) for the next iteration.

Now, one will start from two initial equations of the form (12) in the Euclidean algorithm. Then, by performing linear combinations on these two equations, one obtains a new equation which is the same form of (12). With proper updates, the procedure iterates. First, let $[x^d] = [1] \cdot x^d + [0] \cdot S(x)$ (25)

$[S(x)] = [0] \cdot x^d + [1] \cdot S(x)$ (26)

be the two initial equations which are of the form (12). The initial conditions for the corresponding polynomials are named as $\Omega^{(a)}(x) = x^d$, $\Theta^{(a)}(x) = 1$, $\Lambda^{(a)}(x) = 0$ (27)

$\Omega^{(b)}(x) = S(x)$, $\Theta^{(b)}(x) = 0$, $\Lambda^{(b)}(x) = 1$ (28)

One will make use of the mechanism of the inverse-free BM algorithm to construct the new method.

Assume in the $k^{th}$ iteration $\Omega^{(a)}(x) = \Theta^{(a)}(x) \cdot x^d + \Lambda^{(a)}(x) \cdot S(x)$ (29)

$\Omega^{(b)}(x) = \Theta^{(b)}(x) \cdot x^d + \Lambda^{(b)}(x) \cdot S(x)$ (30)

are the two given equations of the form (12). One will perform the linear combination on equations by $\delta \cdot (29) + \gamma \cdot (30)$ to obtain the third equation $\Omega^{(c)}(x) = \Theta^{(c)}(x) \cdot x^d + \Lambda^{(c)}(x) \cdot S(x)$ (31)

which is also of the form (12). The individual terms in (31) are formulated as $\Omega^{(c)}(x) = \delta \cdot \Omega^{(a)}(x) + \gamma \cdot \Omega^{(b)}(x) \Theta^{(c)}(x) = \delta \cdot \Theta^{(a)}(x) + \gamma \cdot \Theta^{(b)}(x) \Lambda^{(c)}(x) = \delta \cdot \Lambda^{(a)}(x) + \gamma \cdot \Lambda^{(b)}(x)$ (32)

The field elements $\delta$ and $\gamma$ are chosen in order to produce additional zero coefficient of $\Omega^{(c)}(x)$ at the $k^{th}$ position. The candidates are $\delta = \Omega_k^{(b)}$ and $\gamma = \Omega_k^{(a)}$. On the other hand, the discrepancy $\delta$ in (21) is the $k^{th}$ coefficient of $\Lambda^{(b)}(x) \cdot S(x)$, which, in comparison to (30), has exactly the value $\Omega_k^{(b)}$. The term $\gamma$ is either left unchanged of nonzero value, or the previous non-zero $\delta$ which, in comparison to (29), is actually of the value $\Omega_k^{(a)}$. Thus the method is now re-expressed as follows named as Method 1. Note that $\Theta(x)$ only serves as an auxiliary polynomial to form the equations (29), (30) and (31), which is not computed in the method.

Method 1.

1. Initially set $k=0$, $l=0$ and $\Omega^{(a)}(x) = x^d$, $\Lambda^{(a)}(x) = 0$ (33)

$\Omega^{(b)}(x) = S(x)$, $\Lambda^{(b)}(x) = 1$

2. Set $k=k+1$. If $k > d-1$, then go to step 4. Otherwise, compute (1). $\Omega^{(a)}(x) \leftarrow x\Omega^{(a)}(x)$, $\Lambda^{(a)}(x) \leftarrow x\Lambda^{(a)}(x)$ (34)

(2). $\delta = \Omega_k^{(b)}$ (35)

(3). If $\Omega_k^{(a)} \neq 0$ then $\gamma = \Omega_k^{(a)}$ else $\gamma = 1$ (36)

(4). $\Omega^{(c)}(x) = \delta \cdot \Omega^{(a)}(x) + \gamma \cdot \Omega^{(b)}(x)$ $\Lambda^{(c)}(x) = \delta \cdot \Lambda^{(a)}(x) + \gamma \cdot \Lambda^{(b)}(x)$ (37)

(5). If, $\delta \neq 0$ and $2l \leq k-1$ then $\Omega^{(a)}(x)=\Omega^{(b)}(x)$, $\Lambda^{(a)}(x)=\Lambda^{(b)}(x)$ and $l=k-l$ (38)

(6). $\Omega^{(b)}(x)=\Omega^{(c)}(x)$, $\Lambda^{(b)}(x)=\Lambda^{(c)}(x)$ (39)

3. Return to step 2.

4. $\Omega^{(c)}(x) \leftarrow \Omega^{(c)}(x) \bmod x^d$ (40)

5. STOP

The equation $\gamma=\delta$ in (23) is no more needed since it is replaced by $\Omega^{(a)}(x)=\Omega^{(b)}(x)$ in (38). The effect of the multiplying $\Omega^{(a)}(x)$ and $\Lambda^{(a)}(x)$ by x in (34) is to produce successive zero coefficients $\Omega_j^{(c)}$ for $d-1 \geq j \geq t+1$. In order to satify the condition $\deg\{\Omega^{(c)}(x)\} \leq t$, one needs the additional equation (40) in step 4, in which the terms of order higher than $x^{d-1}$ are removed. In the form of equation (31), these term can be regarded to be moved to the right hand side of the equation in (31) into the polynomial $\Theta^{(c)}(x)$. The detail of method 1 is demonstrated in the following example (Example 1):

Consider a (15,9) RS code over $GF(2^4)$. Let $c=0$ and $e=a^4x^8+a^3x^5+a^6x^1$ be the codeword and the error polynomial, respectively. Thus the received polynomial is given as $r=c+e=a^4x^8+a^3x^5+a^6x^1$. The syndrome polynomial is computed by (1) as $S(x)=a^6x^6+a^9x^5+a^{11}x^4+a^{12}x^3+a^{11}x^2+a^0x^1$.

Now Method 1 is applied to compute the error evaluator polynomial $\Omega(x)$ and the error locator polynomial $\Lambda(x)$ simultaneously. The initial conditions and the detail data are shown in the attached Table 1. The table is read as follows with the block k=2 as an example. In this block, one has k=2, l=1, $\delta=a^{11}$, $\gamma=a^0$ and $\Omega^{(a)}(x)=a^6x^7+a^9x^6+a^{11}x^5+a^{12}x^4+a^{11}x^3+a^0x^2$ $\Theta^{(a)}(x)=0$ $\Lambda^{(a)}(x)=a^0x^1$ $\Omega^{(b)}(x)=a^0x^8+a^6x^6+a^9x^5+a^{11}x^4+a^{12}x^3+a^{11}x^2+a^0x^1$ $\Theta^{(b)}(x)=a^0x^1$ $\Lambda^{(b)}(x)=a^0$ which are shown at the $1^{st}$ and the $2^{nd}$ rows of this block, respectively. Note that $\Omega^{(a)}(x)$ and $\Lambda^{(a)}(x)$ are displayed after the left-shift (34). Then the polynomial $\Omega^{(c)}(x)$, $\Theta^{(c)}(x)$ and $\Lambda^{(c)}(x)$ are computed by (32) with $\delta=a^{11}$ and $\gamma=a^0$, which yields $\Omega^{(c)}(x)=a^0x^8+a^2x^7+a^9x^6+a^0x^5+a^7x^4+a^2x^3+a^0x^1$ $\Theta^{(c)}(x)=a^0x^1$ $\Lambda^{(c)}(x)=a^{11}x^1+a^0$ as shown in the $3^{rd}$ row of this block. Since 2l>k−1, (38) is not performed. After the updates (39), one obtains the polynomials which are shown in the first two rows in the block of k=3. Again, the first row of the block k=3, $\Omega^{(a)}(x)$ and $\Lambda^{(a)}(x)$ are displayed after the left-shift (34). The final results are shown in the very last row, which are $\Omega^{(c)}(x)=a^{12}x^{10}+a^2x^9+a^2x^8+a^2x^7+a^{12}x^3+a^0x^2+a^3x^1$ $\Theta^{(c)}(x)=a^{12}x^3+a^0x^2+a^3x^1$ $\Lambda^{(c)}(x)=a^2x^4+a^{10}x^3+a^3x^2+a^3x^1$ By (40), $\Omega^{(c)}(x)$ is recomputed as $\Omega^{(c)}(x)=a^{12}x^3+a^0x^2+a^3x^1$. Next, the roots of the error locator polynomial $\Lambda^{(c)}(x)$ are computed as $\{a^7, a^{10}, a^{14}\}$ by Chien's search, and thus the error locations are $\{a^8, a^5, a^1\}$. Finally, by (5), the error magnitudes are computed as $\{a^4, a^3, a^6\}$, and thus the error polynomial computed by the method is $a^4x^8+a^3x^5+a^6x^1$, which is the same as the given error vector.

The New Decoding Method for Correcting Errors (Part II)

The equations (34)–(39) in Method 1 produce zero coefficients for $\Omega^{(c)}(x)$ from the lower order terms. Now, one will perform the combinations in (32) to produce the final polynomial $\Omega^{(c)}(x)$ with zero coefficients $\Omega_j^{(c)}$, for $d-1 \geq j \geq t+1$ directly by choosing different $\delta$ and $\gamma$. The basic idea is to produce the zero coefficients of $\Omega^{(c)}(x)$ always at the $x^d$ position in each iteration by choosing $\delta=\Omega_d^{(b)}$ and $\gamma=\Omega_d^{(a)}$ together with the left-shift operations on $\Omega^{(b)}(x)$ and $\Lambda^{(b)}(x)$ instead of $\Omega^{(a)}(x)$ and $\Lambda^{(a)}(x)$. Thus Method 1 is re-expressed as follows named as Method 2.

Method 2.

1. Initially set k=0, l=0 and $\Omega^{(a)}(x)=x^d$, $\Lambda^{(a)}(x)=0$ $\Omega^{(b)}(x)=S(x)$, $\Lambda^{(b)}(x)=1$ (41)

2. Set k=k+1. If k>d−1, then stop. Otherwise, compute (1). $\Omega^{(b)}(x) \leftarrow x\Omega^{(b)}(x)$, $\Lambda^{(b)}(x) \leftarrow x\Lambda^{(b)}(x)$ (42)

(2). $\delta=\Omega_d^{(b)}$, $\gamma=\Omega_d^{(a)}$ (3). $\Omega^{(c)}(x)=\delta \cdot \Omega^{(a)}(x)+\gamma \cdot \Omega^{(b)}(x)$ $\Lambda^{(c)}(x)=\delta \cdot \Lambda^{(a)}(x)+\gamma \cdot \Lambda^{(b)}(x)$ (43)

(4). If $\delta \neq 0$ and $2l \leq k-1$ then $\Omega^{(a)}(x)=\Omega^{(b)}(x)$, $\Lambda^{(a)}(x)=\Lambda^{(b)}(x)$ and $l=k-l$ (44)

(5). $\Omega^{(b)}(x)=\Omega^{(c)}(x)$, $\Lambda^{(b)}(x)=\Lambda^{(c)}(x)$ (45)

3. Return to step 2.

The test condition and the update in (36) is no more needed since $\Omega_d^{(a)}$ is never zero. The reason for lack of the equation (40) is because $\Omega_j^{(c)}=0$ for $j \geq d$. In (42), the left-shifts are to successively left-shift the zero coefficients $\Omega_j^{(c)}$'s to the positions $d+t—1 \geq j \geq d$, for which the original expected positions are $d-1 \geq j \geq t+1$ because of the requirement of $\deg\{\Omega^{(c)}(x)\} \leq t$.

Due to the left-shift in (42), the final results $\Omega^{(c)}(x)$ and $\Lambda^{(c)}(x)$ are related to the error evaluator polynomial $\Omega(x)$ and the error locator polynomial $\Lambda(x)$ by $\Omega^{(c)}(x)=x^q\Omega(x)$, $\Lambda^{(c)}(x)=x^q\Lambda(x)$ (46)

for some q with $0 \leq q \leq t$. In computing the error magnitudes $Y_l$ in (5), since $\Lambda^{(c)\prime}(x)=qx^{q-1}\Lambda(x)+x^q\Lambda'(x)$ (47)

the derivatives of $\Lambda^{(c)}(x)$ and $\Lambda(x)$ evaluated at $X_l^{-1}$ are related by $\Lambda^{(c)\prime}(X_l^{-1})=qX_l^{-(q-1)}\Lambda(X_l^{-1})+X_l^{-q}\Lambda'(X_l^{-1})=X_l^{-q}\Lambda'(X_l^{-1})$ (48)

Thus one has $$Y_l = \frac{\Omega(X_l^{-1})}{X_l^{-1}\Lambda'(X_l^{-1})} = \frac{X_l^{-q}\Omega(X_l^{-1})}{X_l^{-1}X_l^{-q}\Lambda'(X_l^{-1})} = \frac{\Omega^{(c)}(X_l^{-1})}{X_l^{-1}\Lambda^{(c)\prime}(X_l^{-1})} \quad (49)$$

Thus, the error magnitudes $Y_l$ can be computed from the equation (5) using $\Omega^{(c)}(x)$ and $\Lambda^{(c)}(x)$ directly instead of $\Omega(x)$ and $\Lambda(x)$. The detail data of the iterations of Method 2 is demonstrated in the following example (Example 2):

Consider a (15,9) RS code over $GF(2^4)$. Let $c=0$ and $e=a^4x^8+a^3x^5+a^6x^1$ be the codeword and the error polynomial, respectively. Thus the received polynomial is given as $r=c+e=a^4x^8+a^3x^5+a^6x^1$. The syndrome polynomial is computed by (1) as $S(x)=a^6x^6+a^9x^5+a^{11}x^4+a^{12}x^3+a^{11}x^2+a^0x^1$.

Now, Method 2 is applied to compute $\Omega^{(c)}(x)$ and $\Lambda^{(c)}(x)$ which, by (49), can be used directly to compute the error magnitudes. The initial conditions and the detail data are shown in the attached Table 2. The table is read in the same way as illustrated in Example 1. The final results are shown in the very last row, which are $\Omega^{(c)}(x)=a^{14}x^6+a^2x^5+a^5x^4$ $\Theta^{(c)}(x)=a^{10}x^5+a^8x^4+a^4x^3$ $\Lambda^{(c)}(x)=a^4x^6+a^{12}x^5+a^5x^4+a^5x^3$ Next, the roots of $\Lambda^{(c)}(x)$ are computed as $\{a^7, a^{10}, a^{14}\}$ by the Chien search, and thus the error locations are $\{a^8, a^5, a^1\}$. Finally, by (49), the error magnitudes are computed as $\{a^4a, a^3, a^6\}$ and thus the error polynomial computed by the method is $a^4x^8+a^3x^5+a^6x^1$, which is the same as the given errata vector.

The New Decoding Method for Both Erasures and Errors

Following section II, in addition to $v$ errors, assume $s$ erasures occur with $0 \leq s+2v \leq d-1$. Let $u=(u_{n-1},u_{n-2},\ldots,u_0)$ and $e=(e_{n-1},e_{n-2},\ldots,e_0)$ denote the erasure vector and the error vector, respectively. Then, the received vector $r$ is given by $r=\tilde{u}+c$, where $c$ is a codeword and $\tilde{u}=u+e$ is the errata vector. Thus the syndromes computed from the received vector $r$ can be expressed as $$S_k = \sum_{i=0}^{n-1} r_i \alpha^{ik} = \sum_{i=0}^{n-1} u_i \alpha^{ik} + \sum_{i=0}^{n-1} e_i \alpha^{ik} \text{ for } 1 \leq k \leq d-1 \quad (50)$$

$$= \sum_{i=1}^{s} W_i Z_i^k + \sum_{i=1}^{v} Y_i X_i^k$$

where $W_i$ and $Z_i$ are the $i^{th}$ erasure amplitude and erasure location, respectively, $Y_i$ and $X_i$ are the $i^{th}$ error amplitude and the $i^{th}$ error location, respectively. Note that, $Z_i$'s are known by the definition of erasures. For simplicity, $\tau(x)$ will be defined as the error locator polynomial and the symbol $\Lambda(x)$ will be re-defined as the errata locator polynomial.

Let $\sigma(x)$ be the erasure locator polynomial with zeros at the inverse erasure locations. i.e., $$\sigma(x) = \prod_{j=1}^{s} (1+Z_j x) = \sum_{j=0}^{s} \sigma_j x^j \quad (51)$$

where $\sigma_0=1$. Similarly, let $\tau(x)$ be the error locator polynomial with zeros at the inverse error locations. i.e., $$\tau(x) = \prod_{j=1}^{v} (1+X_j x) = \sum_{j=0}^{v} \tau_j x^j \quad (52)$$

where $\tau_0=1$. As long as the error locations $X_i$'s are computed, the last two terms in (50) can be combined and expressed as $$S_k = \sum_{i=1}^{s+v} \hat{W}_i \hat{Z}_i^k \text{ for } 1 \leq k \leq d-1 \quad (53)$$

where $\hat{W}_i$ and $\hat{Z}_i$ are the $i^{th}$ error amplitude and error location, respectively. Thus, the syndrome polynomial $S(x)$ can be computed as $$S(x) = \sum_{k=1}^{d-1} S_k x^k = \sum_{k=1}^{d-1} \left( \sum_{i=1}^{s+v} \hat{W}_i \hat{Z}_i^k \right) x^k = \sum_{i=1}^{s+v} \hat{W}_i \frac{\hat{Z}_i x + (\hat{Z}_i x)^d}{1+\hat{Z}_i x} \quad (54)$$

Now, let the errata locator polynomial be defined by $$\Lambda(x) = \sigma(x)\tau(x) = \prod_{j=1}^{s+v} (1+\hat{Z}_j x) = \sum_{j=0}^{s+v} \Lambda_j x^j \quad (55)$$

where $\Lambda_0=1$ and $\deg \Lambda(x)=s+v$. Note that $\Lambda(x)$ is the polynomial with zeros at the inverse error locations. Finally, let the errata evaluator polynomial $\Omega(x)$ be defined by $$\Omega(x) = x \sum_{i=1}^{s+v} \hat{W}_i \hat{Z}_i \prod_{l \neq i} (1+\hat{Z}_l x) \quad (56)$$

where $\deg\{\Omega(x)\}=s+v$ and $\Omega(0)=0$. Thus, the Berlekamp's key equation for erasures and errors is given by:

$$S(x)\Lambda(x) \equiv \Omega(x) \bmod x^d \quad (57)$$

which is of the same form (4) except $\Lambda(x)$ is the errata locator polynomial.

Following Forney's method, the errata magnitudes can be computed as $$\hat{W}_l = \frac{\Omega(\hat{Z}_l^{-1})}{\prod_{j \neq l}(1-\hat{Z}_j \hat{Z}_l^{-1})} = \frac{\Omega(\hat{Z}_l^{-1})}{Z_l^{-1}\Lambda'(\hat{Z}_l^{-1})} \text{ for } 1 \leq l \leq s+v \quad (58)$$

where the errata locations can be computed from $\Lambda(x)$ by the Chien search.

The decoding method is to solve the equation (57) for the errata locator polynomial $\Lambda(x)$ and the errata evaluator polynomial $\Omega(x)$ satisfying $$\deg\{\Omega(x)\} \leq s+t \text{ and } \deg\{\Lambda(x)\} \leq s+t \quad (59)$$

Since the erasure locator polynomial $\sigma(x)$ is known, one thus applies Method 2 for correcting errors in the previous section using the special initial conditions $\Omega^{(b)}(x)=\sigma(x) \cdot S(x) \bmod x^d, \Lambda^{(b)}(x)=\sigma(x)$ The new method for correcting both erasures and errors is then expressed as:

1. Initially set $k=0$, $l=0$ and $\Omega^{(a)}(x)=x^d, \Lambda^{(a)}(x)=0$ $\Omega^{(b)}(x)=\sigma(x) \cdot S(x) \bmod x^d, \Lambda^{(b)}(x)=\sigma(x) \quad (60)$ 2. Set $k=k+1$. If $k>d-s-1$, then stop. Otherwise, compute (1). $\Omega^{(b)}(x) \leftarrow x\Omega^{(b)}(x), \Lambda^{(b)}(x) \leftarrow x\Lambda^{(b)}(x) \quad (61)$ (2). $\delta=\Omega_d^{(b)}, \gamma=\Omega_d^{(a)}$ (62)

(3). $\Omega^{(c)}(x)=\delta\cdot\Omega^{(a)}(x)+\gamma\cdot\Omega^{(b)}(x)$ $\Lambda^{(c)}(x)=\delta\cdot\Lambda^{(a)}(x)+\gamma\cdot\Lambda^{(b)}(x)$ (63)

(4). If $\delta\neq0$ and $2l\leq k-1$ then $\Omega^{(a)}(x)=\Omega^{(b)}(x), \Lambda^{(a)}(x)=\Lambda^{(b)}(x)$ and $l=k-l$ (64)

(5). $\Omega^{(b)}(x)=\Omega^{(c)}(x), \Lambda^{(b)}(x)=\Lambda^{(c)}(x)$ (65)

3. Return to step 2.

The outputs $\Omega^{(c)}(x)$ and $\Lambda^{(c)}(x)$ are used to compute the errata magnitudes directly from (58) as illustrated in the previous section.

The equation form of the initial conditions (60) is $[x^d]=[1]\cdot x^d+[0]\cdot S(x)$ $[(\sigma(x)\cdot S(x) \bmod x^d)]=[q(x)]\cdot x^d+[\sigma(x)]\cdot S(x)$ for some polynomial $q(x)$. Since the decoding method is to solve the equation (57) for the errata locator polynomial $\Lambda(x)$ and the errata evaluator polynomial $\Omega(x)$ satisfying (59), it is clear that the method is free of choosing the initial conditions. One will choose the following initial equations which will be used later.

$[x^d+(\sigma(x)\cdot S(x) \bmod x^d)]=[1]\cdot x^d+[\sigma(x)]\cdot S(x))$ $[(\sigma(x)\cdot S(x) \bmod x^d)]=[0]\cdot x^d+[\sigma(x)]\cdot S(x)$ (66)

To reduce the complexity of VLSI implementation, the quantities $\Omega^{(b)}(x)$ and $\Lambda^{(b)}(x)$ are dropped since these terms are always updated from the terms $\Omega^{(c)}(x)$ and $\Lambda^{(c)}(x)$, respectively. The computation in (65) is thus removed and all the superscripts (b) in (60) to (64) are replaced by (c). Some additional quantities are also introduced to simplify the implementation. The control signal update is used to indicate if the first two updates in (64) are to be performed. The last term in (64) will be updated elsewhere. The counter k is changed from $1\leq k\leq d-1-s$ to $s+1\leq k\leq d-1$ and the register length is preset to $l=\lfloor s/2 \rfloor$. The terms $\Omega$tmp0, $\Lambda$tmp0, $\Omega$tmp1, $\Lambda$tmp1 $\Omega$tmp2 and $\Lambda$tmp2 are temporary signals which are used for describing signal flows only and will not be implemented as data register for the VLSI design. The new method is re-expressed as follows named as Method 3.

Method 3.

0. Initial conditions:

$k=s+1, l=\lfloor s/2 \rfloor$, update=0, (67)

$\Omega^{(a)}(x)=x^d+(\sigma(x)\cdot S(x) \bmod x^d), \Lambda^{(a)}(x)=\sigma(x),$ $\Omega^{(c)}(x)=x\cdot(\sigma(x)\cdot S(x) \bmod x^d), \Lambda^{(c)}(x)=x\cdot\sigma(x).$ 1. Set $\delta=\Omega_d^{(c)}, \gamma=\Omega_d^{(a)}$.
2. If $\delta\neq0$ and $2l\leq k-1$ then update=1, $l=k-l$ else update=0

3. Compute $\Omega\text{tmp0}=\delta\cdot\Omega^{(a)}(x)+\gamma\cdot\Omega^{(c)}(x), \Omega\text{tmp1}=\Omega^{(c)}(x)$ $\Lambda\text{tmp0}=\delta\cdot\Lambda^{(a)}(x)+\gamma\cdot\Lambda^{(c)}(x), \Lambda\text{tmp1}=\Lambda^{(c)}(x)$ (68)

4. If update=1 then $\Omega^{(a)}(x)=\Omega\text{tmp1}, \Lambda^{(a)}(x)=\Lambda\text{tmp1}$
5. Compute $\Omega^{(c)}(x)=x\cdot\Omega\text{tmp0}, \Lambda^{(c)}(x)=x\cdot\Lambda\text{tmp0}$
6. Set $k=k+1$. If $k\leq d-1$ then go to step 1. Otherwise STOP.

It should be noted that the outputs $\Omega^{(c)}(x)$ and $\Lambda^{(c)}(x)$ can be substituted directly into (58) to find the error magnitudes instead of $\Omega(x)$ and $\Lambda(x)$ as illustrated in the previous section.

The Merged Method

The computations of the erasure locator polynomial $\sigma(x)$ and the multiplication $\sigma(x)\cdot S(x) \bmod x^d$ can be implemented in a way similar to Method 3. As given in (51), $\sigma(x)$ is defined to have roots at the inverse of the erasure locations $Z_k$'s, $s\geq k\geq 1$, i.e., $\sigma(x)=\Pi_{k=1}^{s}(1+Z_k x)$. The computation of $\sigma(x)$ can be done by the s iterations on the operation $p(x)\leftarrow(1+Z_k x)\cdot p(x)$ with the initial conditions $p(x)=1$. The term $(1+Z_k x)\cdot p(x)$ is computed by $1\cdot p(x)+Z_k\cdot x\cdot p(x)$ which is similar to the second equation in (68) with $\delta=1, \Lambda^{(a)}(x)=p(x), \gamma=Z_k$ and $\zeta^{(a)}(x)=x\cdot p(x)$. The multiplication, $\sigma(x)\cdot S(x) \bmod x^d$ can also be computed in the same way with the same choice of $\gamma$ and $\delta$, and using $p(x)=S(x)$ as the initial condition, which is similar to the first equation in (68). The main differences between this method and Method 3 are:

a. $\Omega^{(c)}(x)$ and $\Lambda^{(c)}(x)$ are used to compute $\sigma(x)\cdot S(x) \bmod x^d$ and $\sigma(x)$, respectively.
b. The initial conditions for k=1 and l=0.
c. At $k^{th}$ iteration, one sets $\delta=1$ and $\gamma=Z_k$.
d. One needs to perform the updates in the step 4 of Method 3, i.e., $\Omega^{(a)}(x)=\Omega^{(c)}(x)$ and $\Lambda^{(a)}(x)=\Lambda^{(c)}(x)$ in every iteration.
e. In order to obtain $\sigma(x)\cdot S(x) \bmod x^d$ directly, one resets the term $\Omega_d^{(c)}$ to zero before the main computation (68) and after the computation, one also resets the term $\Omega_{d+1}^{(c)}$ to zero.
f. The outputs $\Omega^{(c)}(x)$ and $\Lambda^{(c)}(x)$ are $x\cdot(\sigma(x)\cdot S(x) \bmod x^d)$ and $x\cdot\sigma(x)$, respectively. While $\Omega^{(a)}(x)$ and $\Lambda^{(a)}(x)$ are $x^d+(\sigma(x)\cdot S(x^d) \bmod x^d)$ and $\sigma(x)$, respectively.

In the form of (31), the terms $\Omega_d^{(c)}$ and $\Omega_{d+1}^{(c)}$ can be freely set to zero because these terms can be regarded to be moved to the right hand side of (31) and saved in the polynomial $\Theta^{(c)}(x)$. Thus the equality still holds. The method for computing $\sigma(x)\cdot S(x) \bmod x^d$ and $\sigma(x)$ is given as follows named as Method 4, which is similar to the Method 3 with the iteration range $1\leq k\leq s$. Note that some of the steps are redundant, which will be used later.

Method 4.

1. Initial conditions:

$k=1, l=0$, update=0, $\Omega^{(a)}(x)=x^d+S(x), \Lambda^{(a)}(x)=1$ $\Omega^{(c)}(x)=x\cdot S(x), \Lambda^{(c)}(x)=x$ 2. Set $\delta=1, \gamma=Z_k$ and $\Omega_d^{(c)}(x)=0$.
3. If $\delta\neq 0$ and $2l\leq k-1$ then update=1, $l=k-l$ else update=0

4. update=1
5. Compute $\Omega\text{tmp0}=\delta\cdot\Omega^{(a)}(x)+\gamma\cdot\Omega^{(c)}(x),$ $\Lambda\text{tmp0}=\delta\cdot\Lambda^{(a)}(x)+\gamma\cdot\Lambda^{(c)}(x)$ 6. If update=1 then $\Omega^{(a)}(x)=\Omega\text{tmp0}, \Lambda^{(a)}(x)=\Lambda\text{tmp0}$
7. Compute $\Omega^{(c)}(x)=x\cdot\Omega\text{tmp0}, \Lambda^{(c)}(x)=x\cdot\Lambda\text{tmp0}$
8. Set $\Omega_{d+1}^{(c)}=0$
9. Set $k=k+1$. If $k\leq s$ then go to step 1. Otherwise STOP.

At the end of the Method 4, one obtain $k=s, l=\lfloor s/2 \rfloor$ and $\Omega^{(a)}(x)=x^d+(\sigma(x)\cdot S(x)\bmod x^d)$, $\Lambda^{(a)}(x)=\sigma(x)$, $\Omega^{(c)}(x)=x\cdot(\sigma(x)\cdot S(x)\bmod x^d)$, $\Lambda^{(c)}(x)=x\cdot\sigma(x)$.

Note that the term $x^d$ in $\Omega^{(c)}(x)$ is not altered through out the iterations since $\Omega_d^{(c)}$ is reset to zero before the computations. As one has already seen, the outputs of Method 4 are exactly the initial conditions of Method 3. Thus, Method 4, with iteration range $1\leq k\leq s$ is then merged into Method 3 which is of range $s+1\leq k\leq d-1$. The initial conditions in step 0 can be replaced by the simpler initial conditions, $k=0$, $\Omega^{(a)}(x)=x^d$ and $\Lambda^{(a)}(x)=0$, using one additional iteration with $\delta=1$, $\gamma=1$. Thus one defines $Z_0=1$ which doesn't exist originally. The final decoding method is given as follows named as Method 5. The additional control signal decode=0 if the process is computing $\sigma(x)$ and $\sigma(x)\cdot S(x)\bmod x^d$, and the associates. But, decode=1 if the process is computing $\Omega^{(c)}(x)$ and $\Lambda^{(c)}(x)$.

Method 5.

0. Initial conditions:

$k=0$, $l=0$, update=0, decode=0

$\Omega^{(a)}(x)=x^d$, $\Lambda^{(a)}(x)=0$ $\Omega^{(c)}(x)=S(x)$, $\Lambda^{(c)}(x)=1$ 1. If $Z_k=0$ then, decode=0 else decode=1
2. If decode=0 then, $\delta=1$, $\gamma=Z_k$, $\Omega_d^{(c)}=0$ else, $\delta=\Omega_d^{(c)}$, $\gamma=\Omega_d^{(a)}$ 3. If $\delta\neq 0$ and $2l\leq k-1$ then, update=1, $l=k-l$ else, update=0, if decode 0 then update=1

4. Compute $\Omega\text{tmp}0=\delta\cdot\Omega^{(a)}(x)+\gamma\cdot\Omega^{(c)}(x)$, $\Omega\text{tmp}1=\Omega^{(c)}(x)$ $\Lambda\text{tmp}0=\delta\cdot\Lambda^{(a)}(x)+\gamma\cdot\Lambda^{(c)}(x)$, $\Lambda\text{tmp}1=\Lambda^{(c)}(x)$ 5. If decode=0 then, $\Omega\text{tmp}=\Omega\text{tmp}0$, $\Lambda\text{tmp}=\Lambda\text{tmp}0$ else, $\Omega\text{tmp}=\Omega\text{tmp}1$, $\Lambda\text{tmp}=\Lambda\text{tmp}1$ 6. If update=1, then $\Omega^{(a)}(x)=\Omega\text{tmp}$, $\Lambda^{(a)}(x)=\Lambda\text{tmp}$
7. Compute $\Omega^{(c)}(x)=x\cdot\Omega\text{tmp}0$, $\Lambda^{(c)}(x)=x\cdot\Lambda\text{tmp}0$
8. Set $\Omega_{d+1}^{(c)}=0$
9. Set $k=k+1$. If $k\leq d-1$ then, go to step 1. Otherwise STOP.

The detail of Method 5 is demonstrated in the following example (Example 3):

Consider a (15,9) RS code over $GF(2^4)$. Let $c=0$, $e=a^1=x^4$ and $u=a^2x^8+a^{11}x^6+a^6x^5+a^3x^1$ be the codeword, the error polynomial and the erasure polynomial, respectively. Thus erasure locations are given as $Z_0=1$, $Z_1=a^1$, $Z_2=a^5$, $Z_3=a^6$, $Z_4=a^8$, $Z_5=0$ and $Z_6=0$ and the received polynomial is $r=c+u+e=a^2x^8+a^{11}x^6+a^6x^5+a^1x^4+a^3x^1$.

Here, $\tilde{u}=r$. The syndrome polynomial is computed by (50) as $S(x)=a^4x^6+a^0x^5+a^2x^4+a^9x^3+a^4x^2+a^3x^1$.

Also, the erasure locator polynomial is computed by (51) as $\sigma(x)=a^5x^4+a^2x^3+a^{10}x^2+a^{13}x^1+1$ and $\sigma(x)\cdot S(x)\bmod x^d=a^4x^6+a^0x^5+a^4x^3+a^0x^2+a^3x^1$.

Now, Method 5 is applied to compute $\Omega^{(c)}(x)$ and $\Lambda^{(c)}(x)$ which, by (58), can be used directly to compute the errata magnitudes. The initial conditions and the detail data are shown in the attached Table 3. The table is read in the same way as illustrated in Example 1. The table header "c1" and "c2" denote the control signals decode and update, respectively.

For $0\leq k\leq 4$, the process is computing the quantities $\sigma(x)\cdot S(x)\bmod x^d$ and $\sigma(x)$. The control signal decode is always 0. As one can see, the last row of the block $k=4$ shows the needed polynomials. After proper updates, the block $k=5$ starts to decode with the correct initial conditions. For $5\leq k\leq 6$, one has decode=1. The final results are shown in the very last row, which are $\Omega^{(c)}(x)=a^0x^6+a^8x^5+a^9x^3+a^3x^2$ $\Theta^{(c)}(x)=a^{13}x^5+a^8x^4+a^1x^3+a^3x^2+a^3x^1$ $\Lambda^{(c)}(x)=a^9x^6+a^9x^5+a^{13}x^4+a^4x^3+a^{11}x^2+a^0x^1$ Next, the roots of the errata locator polynomial $\Lambda^{(c)}(x)$ are computed as $\{a^7, a^9, a^{10}, a^{11}, a^{14}\}$ by Chien's search, and thus the error locations are $\{a^8, a^6, a^5, a^4, a^1\}$. Finally, by (58), the error magnitudes are computed as $\{a^2, a^{11}, a^6, a^1, a^3\}$, and thus the error polynomial computed by the method is $a^2x^8+a^{11}x^6+a^6x^5+a^1x^4+a^3x^1$, which is the same as the given error polynomial $\tilde{u}$.

The VLSI Design of RS Decoder Using the New Method

Figure 2:
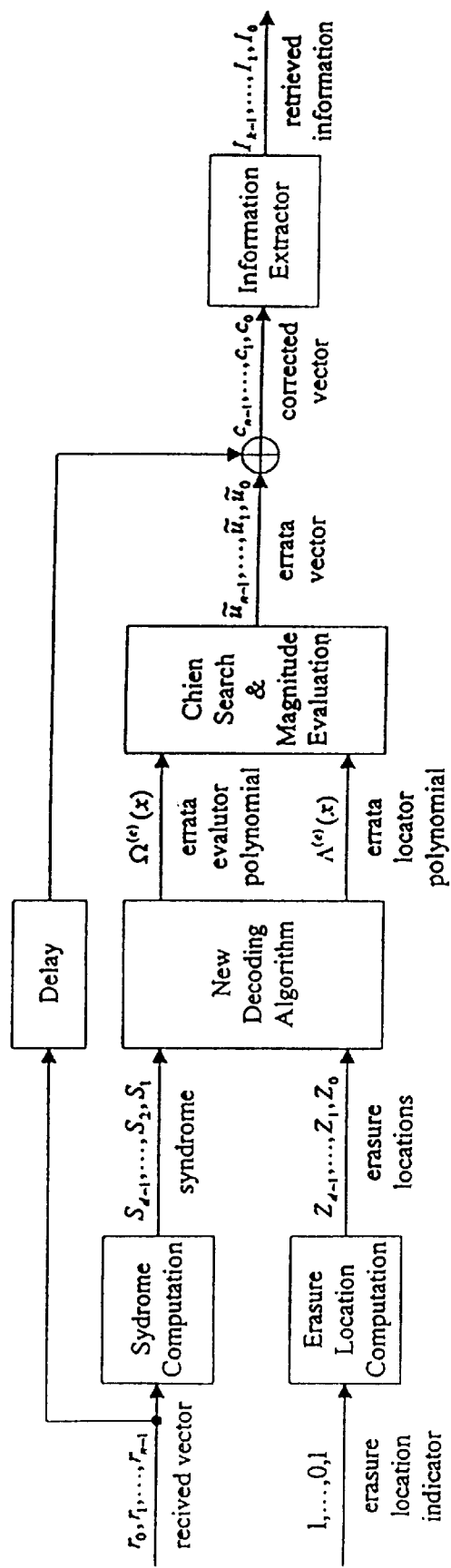
FIG. 2 is a block diagram of an (n,k) RS code over $GF(2^m)$ in time domain.

The overall diagram of an (n,k) RS code over $GF(2^m)$ in time domain using Method 5 is shown in FIG. 2, where $d=n-k+1$ is the minimum distance and $n=2^m-1$. The received vector r is fed into the "Syndrome Computation" unit to obtain the syndromes $S_k$'s, $d-1\geq k\geq 1$. The erasure location indicator $\pi=(\pi_{n-1},\pi_{n-2},\ldots,\pi_0)$ indicates the locations of erasures with $\pi_i=1$ if an erasure occurred at the $i^{th}$ position and $\pi_i=0$ elsewhere, for $i=0,1,\ldots,n-1$. The vector $\pi$ is fed into the "Erasure Location Computation" unit to obtain erasure locations, $Z_k$'s, for $d-1\geq k\geq 0$. Note that, for the case of s erasures with $d-1\geq s\geq 0$, one has $Z_k=0$ for $d-1\geq k\geq s+1$, $Z_k$'s are the erasure locations for $s\geq k\geq 1$ and the term $Z_0$ is defined to be 1 as illustrated in the previous section.

Next, the syndromes and the erasure locations are fed into the "New Decoding Method" unit to obtain $\Omega^{(c)}(x)$ and $\Lambda^{(c)}(x)$ which are related to the errata evaluator polynomial $\Omega(x)$ and the errata locator polynomial $\Lambda(x)$ by (46), and can be fed directly into the "Chien Search & Magnitude Evaluation" unit to obtain the errata vector $\tilde{u}$. Then, the corrected codeword c is computed by summing the errata vector u and the received vector r which is buffered. Finally, the information I is extracted from the corrected code word c by the "Information Extractor" unit.

The "Syndrome Computation" unit, the "Erasure Location Computation" unit and the "Chien Search & Magnitude Evaluation" unit are known. For example, some VLSI architectures for the above-mentioned units are described in J. L. Massey, "Shift-register synthesis and BCH decoding," *IEEE Trans. on Inform. Theory*, vol. IT-15, pp. 122–127, January 1969; I. S. Hsu, T. K. Truong, L. J. Deutsch, E. H.

Figure 3:
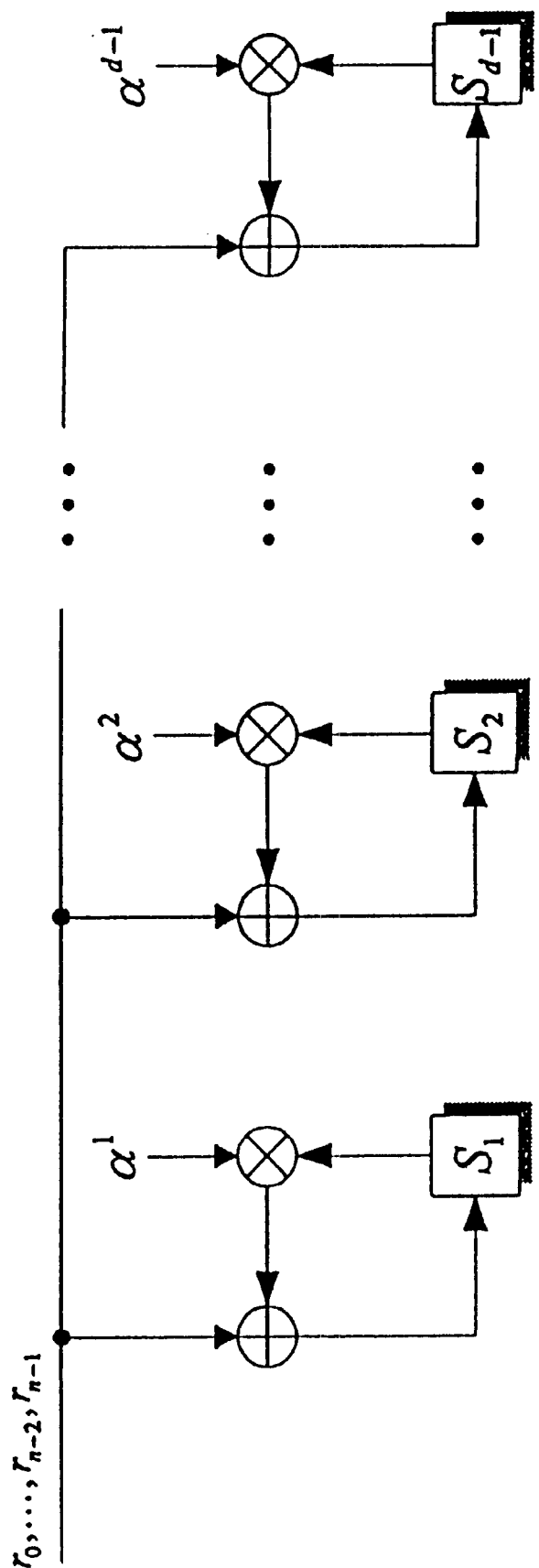
FIG. 3 is a block diagram of a syndrome computation unit.
Figure 4:
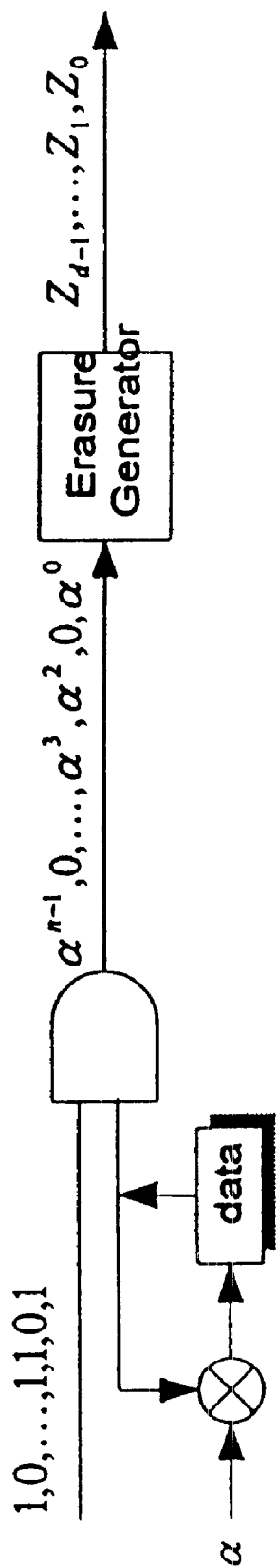
FIG. 4 is a block diagram of erasure location computation unit.
Figure 5:
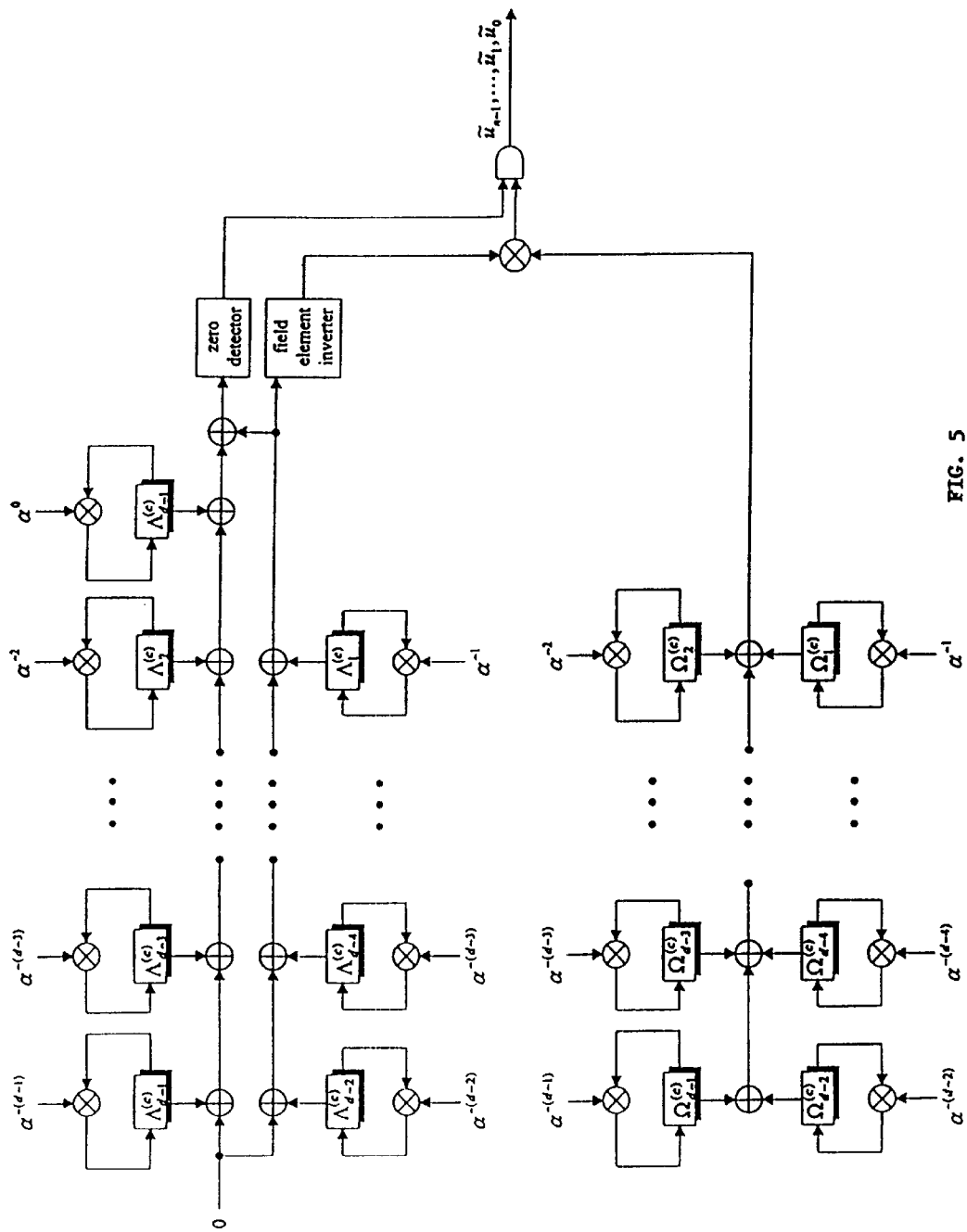
FIG. 5 is a block diagram of a Chien search and the errata magnitude evaluation unit.

Satorius, and I. S. Reed, "A comparison of VLSI architectures for time and transform domain decoding of Reed-Solomon codes, "*TDA Progress Report* 42–92, vol. October–December 1989, Jet Propulsion Laboratory, Pasadena, Calif., pp. 63–81, January 1988; R. E. Blahut, *Theory and practice of error control codes*, Reading, Ma.: Addison-Wesley, 1984; E. R. Berlekamp, *Algebraic coding theory*, New York: McGraw-Hill, 1968; S. B. Wicker, *Error control systems for digital communication and storage*, Englewood Cliffs, N. J.: Prentice-Hall, 1995; and W. Peterson, and E. J. Weldon, Jr., *Error-correcting codes*, Cambridge, Ma.: MIT press, 1972; the contents of which are hereby incorporated by reference. Examples of some VLSI architecture for the above-mentioned units are shown in FIG. 3, FIG. 4 and FIG. 5, respectively. The erasure generator block in the "Erasure Location Computation" unit is essentially a non-zero detector to get the erasure locations $Z_k$'s for $s \geq k \geq 1$ together with a compensation control to set the terms $Z_k$ to be zero for $d-1 \geq k \geq s+1$ and set $Z_0$ to be one. The information extractor unit is merely the truncation of the corrected codeword for systematic encoder. The multipliers and adders in FIGS. 2–6 are represented by circles with "X"s and "+"s in them, respectively.

The implementations of these multipliers and adders using the above-mentioned conventional algorithms are known. However, the disadvantages of these known implementations are that the "field element inverter" of the "Chien Search & Magnitude Evaluation" unit in FIG. 5 and all of the multiplication units in FIGS. 2–5 are slow and require complex VLSI implementation.

Figure 6A:
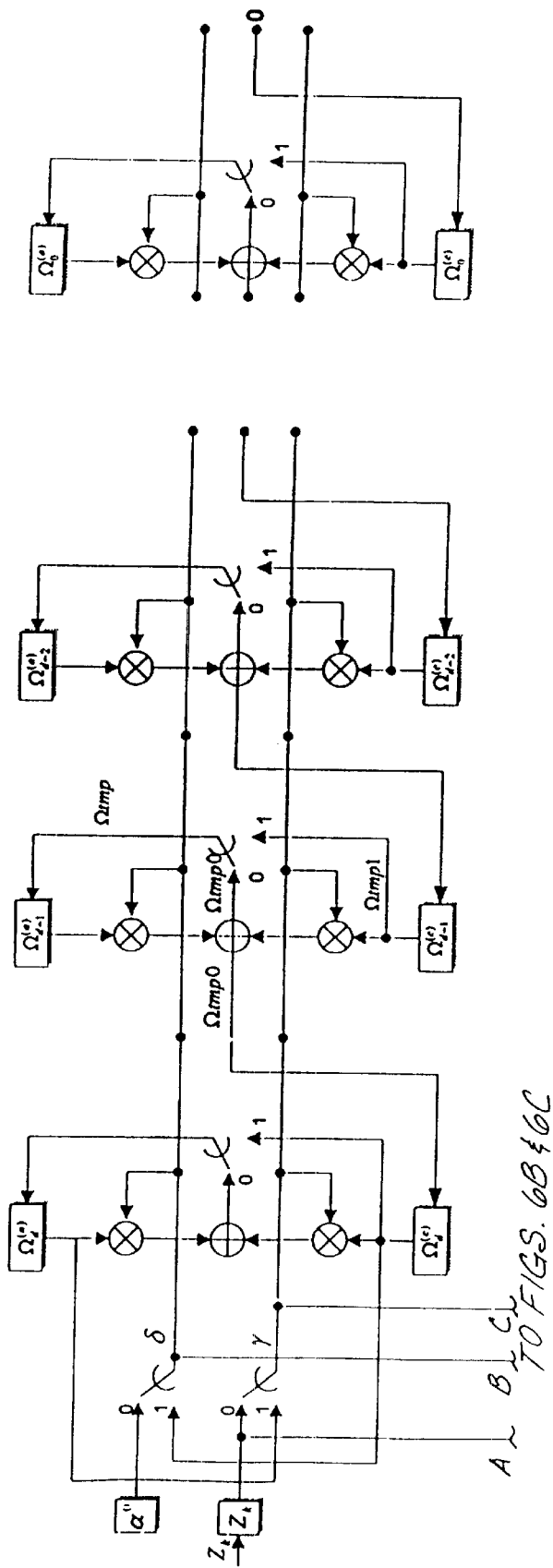
FIG. 6 is a block diagram of one embodiment of decoding unit.
Figure 6B:
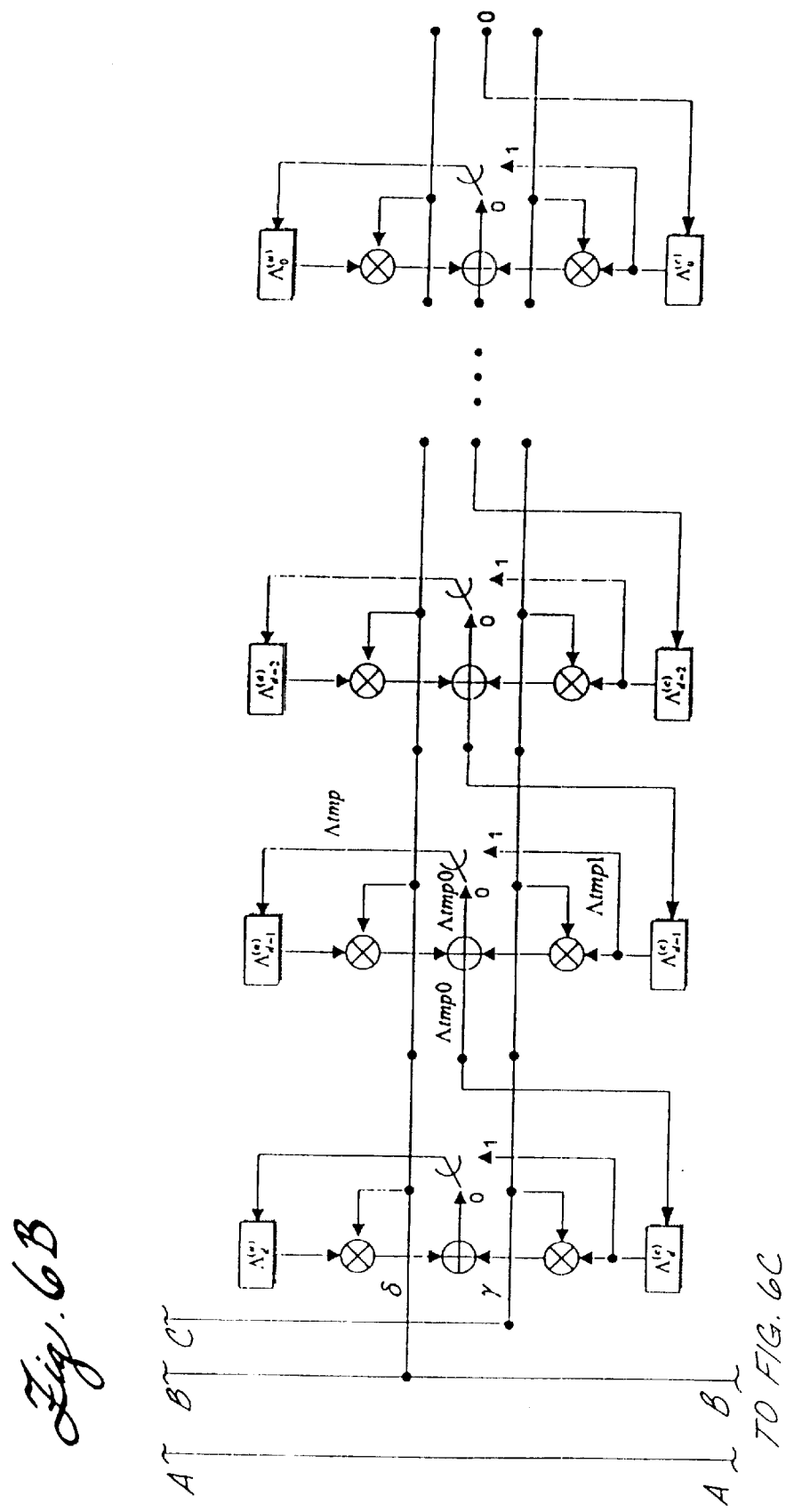
Figure 6C:
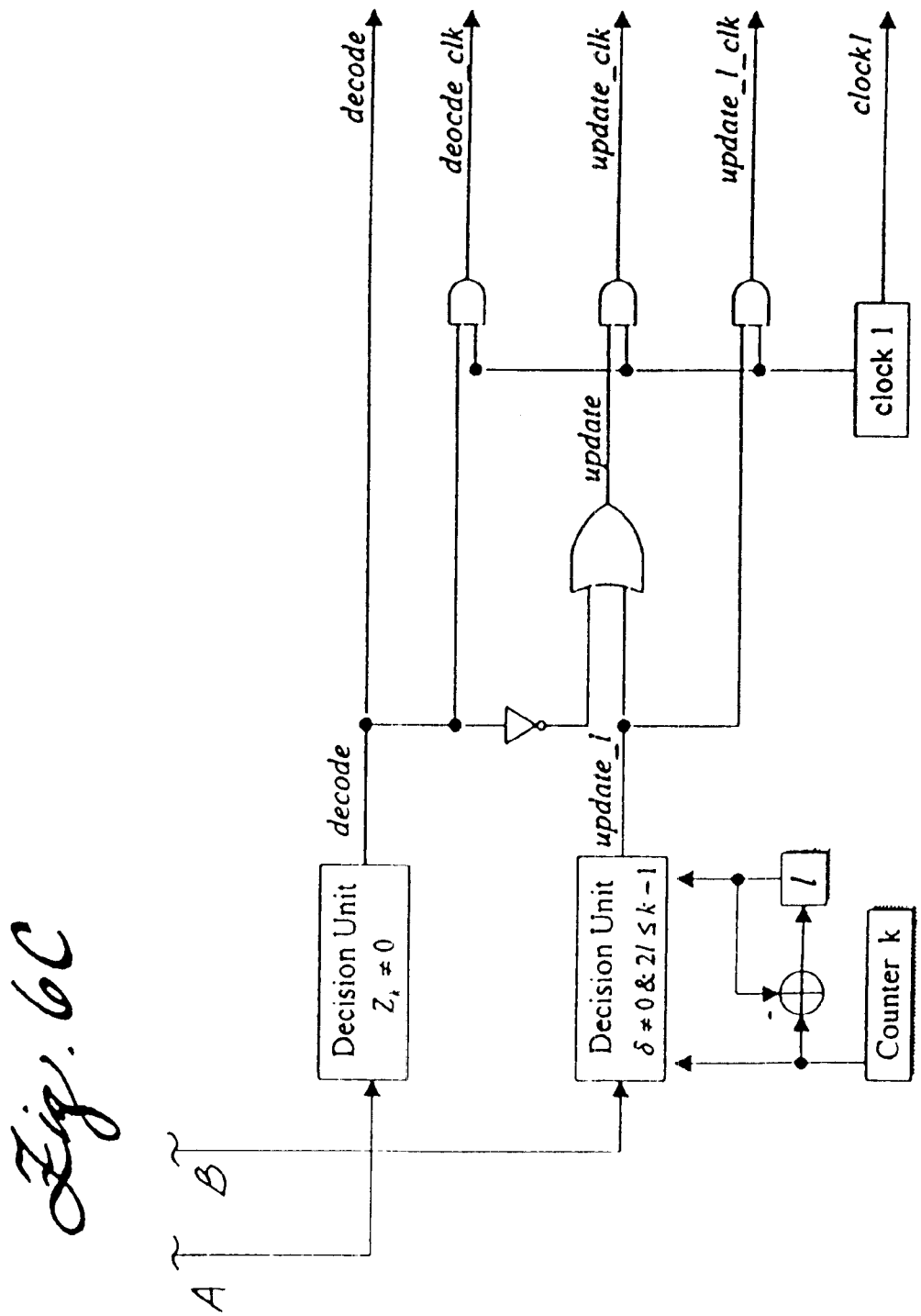

The implementation for Method 5 is given in FIG. 6. The polynomials $\Omega^{(a)}(x)$ and $\Omega^{(c)}(x)$ are paired with their coefficients implemented by data registers and labeled as $\Omega_k^{(a)}$ and $\Omega_k^{(c)}$ for $d \geq k \geq 1$. Similarly, the coefficients of $\Lambda^{(a)}(x)$ and $\Lambda^{(c)}(x)$ are labeled as $\Lambda_k^{(a)}$ and $\Lambda_k^{(c)}$ for $d-1 \geq k \geq 0$. Note that step 8, set $\Omega_{d+1}^{(c)}=0$, in Method 5 is automatically done since no data register is implemented for the term $\Omega_{d+1}^{(c)}$.

The control signal decode is either 0 or 1, which indicates that all the switches are at position 0 or 1, respectively. In addition to the system clock, there is another clock labeled as clock1 with some specific time periods, which is used to trigger all the data registers with some controls. For the initial conditions, all the syndromes are moved into $\Omega^{(c)}(x)$ directly while $Z_k$'s, $d-1 \geq k \geq 0$ are shifted into the unit sequentially by clock1. The signal update_clk is the AND of clock1 and the control signal update, which is used to update the registers of $\Omega^{(a)}(x)$ and $\Lambda^{(a)}(x)$. The signal decode_clk is the AND of clock1 and the control signal decode, which is used to update the register $\Omega_d^{(c)}$. The signal update_1_clk is the AND of clock1 and the control signal update_1, which is used to update the register l. The corresponding register transfer language (RTL) is given as follows.

$T_0$: The initial conditions:

$k \leftarrow 0$, $l \leftarrow 0$, update $\leftarrow 0$, decode $\leftarrow 0$ $\Omega^{(a)}(x) \leftarrow x^d$, $\Lambda^{(a)}(x) \leftarrow 0$ $\Omega^{(c)}(x) \leftarrow S(x)$, $\Lambda^{(c)}(x) \leftarrow 1$ $T_1$: If $Z_k \neq 0$ then decode $\leftarrow 0$ set all switches to position 0, so that $\delta=1$ and $\gamma=Z_k$ $\Omega_d^{(c)} \leftarrow 0$ else decode $\leftarrow 1$ set all switches to position 1, so that $\delta=\Omega_d^{(c)}$ and $\gamma=\Omega_d^{(a)}$ $T_2$: If $\delta \neq 0$ and $2l \leq k-1$ then update_1 $\leftarrow 1$, $l \leftarrow k-l$, else update_1 $\leftarrow 0$ update $\leftarrow$ update_1

If decode=0 then update $\leftarrow 1$ $T_3$: $\Omega \mathrm{tmp} 0 = \delta \cdot \Omega^{(a)}(x) + \gamma \cdot \Omega^{(c)}(x)$, $\Omega \mathrm{tmp} 1 = \Omega^{(c)}(x)$ $\Lambda \mathrm{tmp} 0 = \delta \cdot \Lambda^{(a)}(x) + \gamma \cdot \Lambda^{(c)}(x)$, $\Lambda \mathrm{tmp} 1 = \Lambda^{(c)}(x)$ So that If the switches are at position 0 then $\Omega \mathrm{tmp} = \Omega \mathrm{tmp} 0$, $\Lambda \mathrm{tmp} = \Lambda \mathrm{tmp} 0$ else $\Omega \mathrm{tmp} = \Omega \mathrm{tmp} 1$, $\Lambda \mathrm{tmp} = \Lambda \mathrm{tmp} 1$ $T_4$: If update=1 then $\Omega^{(a)}(x) \leftarrow \Omega \mathrm{tmp}$, $\Lambda^{(a)}(x) \leftarrow \Lambda \mathrm{tmp}$ $T_5$: $\Omega^{(c)}(x) \leftarrow x \cdot \Omega \mathrm{tmp} 0$, $\Lambda^{(c)}(x) \leftarrow x \cdot \Lambda \mathrm{tmp} 0$ $T_6$: $k \leftarrow k+1$. If $k \leq d-1$ then go to step $T_1$, else STOP.

Common synthesis tools, Programmable Logic Arrays, and available VLSI technology libraries known in the field of Integrated Circuit (IC) design may be utilized to implement the RLT description of FIG. 6 in an IC.

Program Implementation and Simulation Results

The new decoding method of the present invention has been verified using a C++ program running on a Pentium 133 PC. The program is implemented to correct s erasures and v errors for the general (n,k) RS codes over $GF(2^m)$, where n is of the form $n=2^m-1$, $1 \leq k \leq n-1$, $0 \leq v \leq \lfloor (n-k)/2 \rfloor$ and $s+2v \leq d-1$. Here $d=n-k+1$ is known as the minimum distance of the RS code. An example of this simulation is given for a (255,239) RS code, which corrects v errors for $1 \leq v \leq 8$. The computation times are given in the first row of the attached Table 4. The times are in mini-second, which are averaged from 100 computations of finding the error locator polynomials and the error evaluator polynomials. The error patterns are randomly generated over all possible locations and magnitudes.

To demonstrate the efficiency of this new method, the simulation results of the inverse-free BM algorithm and the Euclidean algorithm are also presented in Table 4 on the $2^{nd}$ and $3^{rd}$ row, respectively. The computation times are of the same specifications and the error patterns are the same as those in the first row. It is clear that the new method is much faster than the other two methods. Attached Table 5 and Table 6 are the time tables for the new decoding method and the inverse-free BM algorithm for a (255,239) RS code, respectively, which correct both s erasures and v errors satisfying $s+2v \leq 16$.

A finite field multiplier and a finite field inverter are described to speed up and simplify the VLSI implementation for the field element inverter of FIG. 5 and the multipliers of FIGS. 3–5 as follows. The finite field multiplier can also be used for the multipliers of FIG. 6 to further speed up the decoding process. The multipliers are represented in FIGS. 3–6 by the circles with "X"s in them.

Finite Field Multiplier:

Let $p(x)=x^8+x^4+x^3+x^2+1$ be the primitive polynomial generating the finite filed $GF(2^8)$. For a $\in GF(2^8)$, one denotes a in the polynomial form as $a(x)=\Sigma_{j=0}^{7} a_j x^j$ or in the vector form as $a=[a_7, a_6, \ldots, a_0]$. For $a(x)$ and $b(x)$ in $GF(2^8)$, the multiplication $d(x)$ of $a(x)$ and $b(x)$ is defined by $$d(x) = a(x) \cdot b(x) \bmod p(x) \qquad (69)$$

Now, equation (69) can be implemented in the matrix form as follows.
1. f(x)=x·b(x)mod p(x) is equivalent to f=Hb, where $$H = \begin{bmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{bmatrix}$$

2. $g(x)=x^j \cdot b(x) \mod p(x)$ is equivalent to $g=H^j b$.
3. $h(x)=a_j \cdot b(x) \mod p(x)$ is equivalent to $h=a_j b$.

Combining the three cases above, (1) is equivalent to $$d = \left( \sum_{j=0}^{7} a_j H^j \right) b = Ab \quad (70)$$

Where b is in the vector form as $b=[b_7, b_6, \ldots, b_0]$ and $H^0$ is the 8×8 identity matrix. The multiplication matrix A in (70) is pre-computed as $$A = \begin{bmatrix} a_6+a_5+a_4+a_0 & a_7+a_6+a_5+a_1 & a_7+a_6+a_2 & a_7+a_3 & a_4 & a_5 & a_6 & a_7 \\ a_5+a_4-a_3 & a_6+a_5+a_4+a_0 & a_7+a_6+a_5+a_1 & a_7+a_6+a_2 & a_7+a_3 & a_4 & a_5 & a_6 \\ a_4+a_3+a_2 & a_5+a_4+a_3 & a_6+a_5+a_4+a_0 & a_7+a_6+a_5+a_1 & a_7+a_6+a_2 & a_7+a_3 & a_4 & a_5 \\ a_7+a_3+a_2+a_1 & a_4+a_3+a_2 & a_5+a_4+a_3 & a_6+a_5+a_4+a_0 & a_7+a_6+a_5+a_1 & a_7+a_6+a_2 & a_7+a_3 & a_4 \\ a_5+a_4+a_2+a_1 & a_6+a_5+a_3+a_2 & a_7+a_6+a_4+a_3 & a_7+a_5+a_4 & a_6+a_5+a_0 & a_7+a_6+a_1 & a_7+a_2 & a_3 \\ a_6+a_5+a_3+a_1 & a_7+a_6+a_4+a_2 & a_7+a_5+a_3 & a_6+a_4 & a_7+a_5 & a_6+a_0 & a_7+a_1 & a_2 \\ a_7+a_6+a_2 & a_7+a_3 & a_4 & a_5 & a_6 & a_7 & a_0 & a_1 \\ a_7+a_6+a_5+a_1 & a_7+a_6+a_2 & a_7+a_3 & a_4 & a_5 & a_6 & a_7 & a_0 \end{bmatrix} \quad (71)$$

In one embodiment of the present invention, equation (70) can be implemented in parallel using combinational logic circuits given the pre-computed matrix A in equation (71). A combinational circuit comprises of logic gates whose outputs at any time are determined directly from the present combination of inputs without regard to previous inputs. This results in simplified and fast electronic circuits. Combinational circuits perform a specific information processing operation fully specified by a set of Boolean functions logically as shown by equation (71) and the attached Appendix I. A combinational circuit comprises of input variables, logic gates, and output variables. The logic gates accept signals from the inputs and generate signals to the outputs. This process transforms binary information from the given input data to the required output data.

In general modulo 2 additions can be performed by Exclusive OR gates and modulo 2 multiplications can be performed by AND gates. In this example, the elements of matrix A, as given by equation (71), can be implemented using Exclusive Or gates for addition in modulo 2. Thus, the product of b and A is implemented using a combination of Exclusive Or gates (for elements of A) and AND gates to multiply A by b, as required by equation (70). Common synthesis tools, Programmable Logic Arrays, and available VLSI technology libraries known in the field of IC design may be utilized to implement equation (70). In an exemplary embodiment, equation (70) requires about 130 logic gates with data arrival time of 3 ns.

Finite Field Inverter:

The determinant of the matrix A in (71) is computed as $$\det(A)=(a_7-1)(a_6-1)(a_5-1)(a_4-1)(a_3-1)(a_2-1)(a_1-1)(a_0-1)-1$$

where the operation e−1 for the one-bit data e denotes the logic operation NOT of e, i.e., $\bar{e}$. Thus the determinant det(A) is 1 except for a=0. The inverse of a non-zero element a is implemented by $$c = a^{-1} = A^{-1} 1$$

where the field element 1=[0,0,0,0,0,0,0,1] in the vector form. For a=0, the "inverse" of a is defined to be 0. The expansion of each element of c is given in Appendix I. Therefore, c can also be implemented using combinational logic gates. For example, as shown in Appendix I, a portion of c[7] that is equal to a[5]&a[6]&a[7]&a[2]&a[0]^a[4]^a[3], etc can be implemented by using AND gates (for "&s") and exclusive OR gates (for "^"). Common synthesis tools, Programmable Logic Arrays, and available VLSI technology libraries known in the field of IC design may be utilized to implement the above inversion using combinational logic to implement the values of c as given in Appendix I. In an exemplary embodiment, the implementation employs combinational logic using about 1000 logic gates with the data arrival time of 5 ns.

It is understood that the exemplary algorithms and the respective VLSI implementations described herein and shown in the drawings represents only one embodiment of the present invention. Indeed, various modifications and additions may be made to such embodiment without departing from the spirit and scope of the invention. For example, the present invention can also be implemented utilizing a computer program. Furthermore, those skilled in the art will appreciate that the algorithm of the present invention is applicable to Reed-Solomon codes having various different sizes. Thus, the description herein of a (255, 239) Reed-Solomon code is by way of illustration only, and not by way of limitation. Further, those skilled in the art will appreciate that various different VLSI implementations of the present invention are contemplated. Thus, these and other modifications and additions may be obvious to those skilled in the art and may be implemented to adapt the present invention for use in a variety of different applications.

TABLE 1

Detail data of the iterations for Example 1.

| k | l | δ | γ | Ω(x) 12 | 10 | 9 | 8 | 7 | 6 | 5 | 4 | 3 | 2 | 1 | 0 | = | Θ(x) 4 | 3 | 2 | 1 | 0 |
|---|---|---|---|----|----|---|---|---|---|---|---|---|---|---|---|---|---|---|---|---|---|
|   | Initial Conditions |   |   |    |    |   |   | 0 | 6 | 9 | 11 | 12 | 11 | 0 |   |   |   |   |   |   | 0 |
| 1 | 0 | 0 | 0 |    |    |   | 0 |   | 6 | 9 | 11 | 12 | 11 | 0 |   |   |   |   |   |   | 0 |
|   |   |   |   |    |    |   | 0 |   | 6 | 9 | 11 | 12 | 11 | 0 |   |   |   |   |   |   | 0 |
| 2 | 1 | 11 | 0 |   |    |   |   | 6 | 9 | 11 | 12 | 11 | 0 |   |   |   |   |   |   |   | 0 |
|   |   |   |   |    |    |   | 0 |   | 6 | 9 | 11 | 12 | 11 | 0 |   |   |   |   |   |   | 0 |
|   |   |   |   |    |    |   | 0 | 2 | 9 | 0 | 7 | 2 | 0 |   |   |   |   |   |   |   | 0 |
| 3 | 1 | 2 | 0 |    |    |   |   | 6 | 9 | 11 | 12 | 11 | 0 |   |   |   |   |   |   |   |   |
|   |   |   |   |    |    |   | 0 | 2 | 9 | 0 | 7 | 2 |   | 0 |   |   |   |   |   |   | 0 |
|   |   |   |   |    |    |   | 2 | 9 | 10 | 3 | 5 |   |   | 0 |   |   |   |   |   |   | 0 |
| 4 | 2 | 5 | 2 |    |    | 0 | 2 | 9 | 0 | 7 | 2 |   | 0 |   |   |   |   | 0 |   |   | 0 |
|   |   |   |   |    |    | 2 | 9 | 10 | 3 | 5 |   |   | 0 |   |   |   |   |   |   |   | 0 |
|   |   |   |   |    |    | 5 | 3 | 10 | 14 | 14 |   |   | 5 | 2 |   |   |   |   | 5 | 2 |   |
| 5 | 2 | 14 | 2 |   | 0 | 2 | 9 | 0 | 7 | 2 |   | 0 |   |   |   |   | 0 |   |   |   |   |
|   |   |   |   |    |    | 5 | 3 | 10 | 14 | 14 |   |   | 5 | 2 |   |   |   |   | 5 | 2 |   |
|   |   |   |   |    | 14 | 14 | 4 | 5 | 11 |   | 14 | 7 | 4 |   |   |   | 14 | 7 | 4 |   |   |
| 6 | 3 | 11 | 14 |   | 5 | 3 | 10 | 14 | 14 |   |   | 5 | 2 |   |   |   |   | 5 | 2 |   |   |
|   |   |   |   |    | 14 | 14 | 4 | 5 | 11 |   | 14 | 7 | 4 |   |   |   | 14 | 7 | 4 |   |   |
|   |   |   |   |    | 12 | 2 | 2 | 2 |   |   | 12 | 0 | 3 |   |   |   | 12 | 0 | 3 |   |   |

| k | l | δ | γ | * | x⁷ | + | Λ(x) 4 | 3 | 2 | 1 | 0 | * | S(x) |
|---|---|---|---|---|-----|---|----|---|---|---|---|---|------|
|   | Initial Conditions |   |   |   |   |   |   |   |   |   | 0 |   |   |
| 1 | 0 | 0 | 0 |   |   |   |   |   |   |   | 0 |   |   |
|   |   |   |   |   |   |   |   |   |   |   | 0 |   |   |
| 2 | 1 | 11 | 0 |   |   |   |   |   |   | 0 |   |   |   |
|   |   |   |   |   |   |   |   |   |   |   | 0 |   |   |
|   |   |   |   |   |   |   |   |   |   | 11 | 0 |   |   |
| 3 | 1 | 2 | 0 |   |   |   |   |   | 0 |   |   |   |   |
|   |   |   |   |   |   |   |   |   |   | 11 | 0 |   |   |
|   |   |   |   |   |   |   |   |   | 2 | 11 | 0 |   |   |
| 4 | 2 | 5 | 2 |   |   |   |   |   | 11 | 0 |   |   |   |
|   |   |   |   |   |   |   |   |   | 2 | 11 | 0 |   |   |
|   |   |   |   |   |   |   |   |   | 0 | 7 | 2 |   |   |
| 5 | 2 | 14 | 2 |   |   |   |   | 11 | 0 |   |   |   |   |
|   |   |   |   |   |   |   |   |   | 0 | 7 | 2 |   |   |
|   |   |   |   |   |   |   |   | 10 | 13 | 9 | 4 |   |   |
| 6 | 3 | 11 | 14 |   |   |   |   | 0 | 7 | 2 |   |   |   |
|   |   |   |   |   |   |   |   | 10 | 13 | 9 | 4 |   |   |
|   |   |   |   |   |   |   |   | 2 | 10 | 3 | 3 |   |   |

TABLE 2

Detail data of the iterations for Example 2.

| k | l | δ | γ | Ω(x) 8 | 7 | 6 | 5 | 4 | 3 | 2 | 1 | 0 | = | Θ(x) 5 | 4 | 3 | 2 | 1 | 0 |
|---|---|---|---|----|---|---|---|---|---|---|---|---|---|----|---|---|---|---|---|
|   | Initial Conditions |   |   | 0 |   | 6 | 9 | 11 | 12 | 11 | 0 |   |   |   |   |   |   |   | 0 |
| 1 | 0 | 6 | 0 | 0 |   |   |   |   |   |   |   |   |   |   |   |   |   |   | 0 |
|   |   |   |   |    | 6 | 9 | 11 | 12 | 11 | 0 |   |   |   |   |   |   |   |   |   |
|   |   |   |   |    |   | 9 | 11 | 12 | 11 | 0 |   |   |   |   |   |   |   |   | 6 |
| 2 | 1 | 9 | 6 | 6 | 9 | 11 | 12 | 11 | 0 |   |   |   |   |   |   |   |   |   |   |
|   |   |   |   |    | 9 | 11 | 12 | 11 | 0 |   |   |   |   |   |   |   |   | 6 |   |
|   |   |   |   |    |   | 6 | 11 | 3 | 9 | 9 |   |   |   |   |   |   |   | 12 |   |
| 3 | 1 | 6 | 6 | 6 | 9 | 11 | 12 | 11 | 0 |   |   |   |   |   |   |   |   |   |   |
|   |   |   |   |    | 6 | 11 | 3 | 9 | 9 |   |   |   |   |   |   |   | 12 |   |   |
|   |   |   |   |    | 8 | 11 | 14 | 8 | 6 |   |   |   |   |   |   | 3 |   |   |   |
| 4 | 2 | 8 | 6 | 6 | 11 | 3 | 9 | 9 |   |   |   |   |   |   |   | 12 |   |   |   |
|   |   |   |   |    | 8 | 11 | 14 | 8 | 6 |   |   |   |   |   | 3 |   |   |   |   |
|   |   |   |   |    |   | 10 | 3 | 13 | 7 |   |   |   |   | 9 | 5 |   |   |   |   |
| 5 | 2 | 10 | 6 | 6 | 11 | 3 | 9 | 9 |   |   |   |   |   |   |   | 12 |   |   |   |
|   |   |   |   |    | 10 | 3 | 13 | 7 |   |   |   |   |   | 9 | 5 |   |   |   |   |

TABLE 2-continued

Detail data of the iterations for Example 2.

| | | | | | | | | | | | | | | | | |
|---|---|---|---|---|---|---|---|---|---|---|---|---|---|---|---|---|
| | | | | | 5 | 11 | 11 | 4 | | | | | 0 | 11 | 7 | |
| 6 | 3 | 5 | 10 | 10 | 3 | 13 | 7 | | | | | | 9 | 5 | | |
| | | | | 5 | 11 | 11 | 4 | | | | | 0 | 11 | 7 | | |
| | | | | | 14 | 2 | 5 | | | | | 10 | 8 | 4 | | |

| | | | | | | | Λ(x) | | | | | | | |
|---|---|---|---|---|---|---|---|---|---|---|---|---|---|---|
| k | l | δ | γ | * | $x^7$ | + | 6 | 5 | 4 | 3 | 2 | 1 | 0 | * S(x) |
| | Initial Conditions | | | | | | | | | | | | 0 | |
| 1 | 0 | 6 | 0 | | | | | | | | | | 0 | |
| | | | | | | | | | | | | | 0 | |
| | | | | | | | | | | | | | 0 | |
| 2 | 1 | 9 | 6 | | | | | | | | | | 0 | |
| | | | | | | | | | | | 0 | | | |
| | | | | | | | | | | | 6 | | 9 | |
| 3 | 1 | 6 | 6 | | | | | | | | | | 0 | |
| | | | | | | | | | | 6 | 9 | | | |
| | | | | | | | | | | 12 | 0 | 6 | | |
| 4 | 2 | 8 | 6 | | | | | | | 6 | 9 | | | |
| | | | | | | | | | 12 | 0 | 6 | | | |
| | | | | | | | | | 3 | 8 | 7 | | | |
| 5 | 2 | 10 | 8 | | | | | | | 6 | 9 | | | |
| | | | | | | | | 3 | 8 | 7 | | | | |
| | | | | | | | | 9 | 14 | 12 | 4 | | | |
| 6 | 3 | 5 | 10 | | | | | | 3 | 8 | 7 | | | |
| | | | | | | | 9 | 14 | 12 | 4 | | | | |
| | | | | | | | 4 | 12 | 5 | 5 | | | | |

TABLE 3

Detail data of the iterations for Example 3.

| | | | | | | | | | Ω(x) | | | | | | | Θ(x) | | | | |
|---|---|---|---|---|---|---|---|---|---|---|---|---|---|---|---|---|---|---|---|---|
| k | c1 | c2 | 1 | δ | γ | 8 | 7 | 6 | 5 | 4 | 3 | 2 | 1 | 0 | = | 5 | 4 | 3 | 2 | 1 | 0 |
| | | Initial Conditions | | | | | | 4 | 9 | 2 | 9 | 4 | 3 | | | | | | | | 0 |
| 0 | 0 | 1 | 0 | 0 | 0 | 0 | | | | | | | | | | | | | | | 0 |
| | | | | | | | | 4 | 9 | 2 | 9 | 4 | 3 | | | | | | | | |
| | | | | | | 0 | 4 | 9 | 2 | 9 | 4 | 3 | | | | | | | | | |
| 1 | 0 | 1 | 0 | 0 | 1 | 0 | 4 | 9 | 2 | 9 | 4 | 3 | | | | | | | | | 0 |
| | | | | | | | 9 | 2 | 9 | 4 | 3 | | | | | | | | | | 4 |
| | | | | | | 0 | 2 | 1 | 4 | 6 | | 3 | | | | | | | | | 10 |
| 2 | 0 | 1 | 0 | 0 | 8 | 0 | 2 | 1 | 4 | 6 | | 3 | | | | | | | | | 10 |
| | | | | | | | 1 | 4 | 6 | | 3 | | | | | | | | 5 | 2 |
| | | | | | | 0 | 11 | 13 | 9 | 6 | 11 | 3 | | | | | | | 13 | | |
| 3 | 0 | 1 | 1 | 0 | 5 | 0 | 11 | 13 | 9 | 6 | 11 | 3 | | | | | | | 13 | | |
| | | | | | | | 13 | 6 | 6 | 11 | 3 | | | | | | | 13 | 0 | 11 |
| | | | | | | 0 | 5 | 2 | 2 | 11 | 7 | 3 | | | | | | 3 | 7 | 1 |
| 4 | 0 | 1 | 1 | 0 | 6 | 0 | 5 | 2 | 2 | 11 | 7 | 3 | | | | | | 3 | 7 | 1 |
| | | | | | | | 2 | 2 | 11 | 7 | 3 | | | | | | 3 | 7 | 4 | 5 |
| | | | | | | 0 | 4 | 0 | | 4 | 0 | 3 | | | | | 9 | 8 | 6 | 6 |
| 5 | 1 | 1 | 2 | 4 | 0 | 0 | 4 | 0 | | 4 | 0 | 3 | | | | | 9 | 8 | 6 | 6 |
| | | | | | | | 4 | 0 | | 4 | 0 | 3 | | | | 9 | 8 | 6 | 13 | |
| | | | | | | | 2 | 4 | 4 | 2 | 7 | 7 | | | | 9 | 3 | 4 | 9 | 10 |
| 6 | 1 | 1 | 2 | 2 | 4 | 4 | 0 | | 4 | 0 | 3 | | | | | 9 | 8 | 6 | 13 | |
| | | | | | | 2 | 4 | 4 | 2 | 7 | 7 | | | | | 9 | 3 | 4 | 9 | 10 |
| | | | | | | | 0 | 8 | | 9 | 3 | | | | | 13 | 8 | 1 | 3 | 3 |

| | | | | | | | | | Λ(x) | | | | | | |
|---|---|---|---|---|---|---|---|---|---|---|---|---|---|---|---|
| k | c1 | c2 | 1 | δ | γ | * | $x^7$ | + | 6 | 5 | 4 | 3 | 2 | 1 | 0 | * S(x) |
| | | Initial Conditions | | | | | | | | | | | | | 0 |
| 0 | 0 | 1 | 0 | 0 | 0 | | | | | | | | | | 0 |
| | | | | | | | | | | | | | | | 0 |
| 1 | 0 | 1 | 0 | 0 | 1 | | | | | | | | | | 0 |
| | | | | | | | | | | | | | 0 | | |
| | | | | | | | | | | | | | 1 | 0 | |

TABLE 3-continued

Detail data of the iterations for Example 3.

| | | | | | | | | | | | | | | |
|---|---|---|---|---|---|---|---|---|---|---|---|---|---|---|
| 2 | 0 | 1 | 0 | 0 | 8 | | | | | | | 1 | 0 | |
| | | | | | | | | | | | 1 | 0 | | |
| | | | | | | | | | | | 9 | 10 | 0 | |
| 3 | 0 | 1 | 1 | 0 | 5 | | | | | | 9 | 10 | 0 | |
| | | | | | | | | | | 9 | 10 | 0 | | |
| | | | | | | | | | | 14 | 7 | 0 | 0 | |
| 4 | 0 | 1 | 1 | 0 | 6 | | | | | 14 | 7 | 0 | 0 | |
| | | | | | | | | | 14 | 7 | 0 | 0 | | |
| | | | | | | | | | 5 | 2 | 10 | 13 | 0 | |
| 5 | 1 | 1 | 2 | 4 | 0 | | | | 5 | 2 | 10 | 13 | 0 | |
| | | | | | | | | 5 | 2 | 10 | 13 | 0 | | |
| | | | | | | | | 5 | 11 | 7 | 2 | 8 | 4 | |
| 6 | 1 | 1 | 2 | 2 | 4 | | | | 5 | 2 | 10 | 13 | 0 | |
| | | | | | | | 5 | 11 | 7 | 2 | 8 | 4 | | |
| | | | | | | | 9 | 9 | 13 | 4 | 11 | 0 | | |

TABLE 4

Time table for finding the error locator and evaluator polynomial using the new algorithm, the BM algorithm and the Euclidean algorithms for a (255,239) RS code. Each entry is the time in mini-second needed for one block computation, which is averaged from 100 computations.

| Errors | 1 | 2 | 3 | 4 | 5 | 6 | 7 | 8 |
|---|---|---|---|---|---|---|---|---|
| New | 126.1 | 127.1 | 128.7 | 129.2 | 132.9 | 133.0 | 132.9 | 133. |
| BM | 422.9 | 422.5 | 422.5 | 423.2 | 421.5 | 423.4 | 422.5 | 421. |
| EU | 772.0 | 1546.5 | 2319.5 | 3094.1 | 3869.9 | 4641.8 | 5415.5 | 6188. |

TABLE 5

Time table for finding the errata locator and evaluator polynomial using the new algorithm for a (255,239) RS code. Each entry is the time in mini-second needed for one block computation, which is averaged from 100 computations.

| s \ t | 0 | 1 | 2 | 3 | 4 | 5 | 6 | 7 | 8 |
|---|---|---|---|---|---|---|---|---|---|
| 0 | 0.00 | 126.10 | 127.05 | 128.70 | 129.18 | 132.91 | 132.99 | 132.87 | 132.95 |
| 1 | 124.07 | 127.03 | 129.40 | 130.58 | 132.01 | 132.98 | 133.27 | 133.34 | |
| 2 | 125.61 | 127.48 | 129.64 | 130.32 | 130.86 | 132.51 | 133.41 | 132.57 | |
| 3 | 127.55 | 128.96 | 130.18 | 133.54 | 132.61 | 133.49 | 133.48 | | |
| 4 | 128.67 | 129.33 | 130.42 | 131.76 | 132.56 | 133.81 | 133.55 | | |
| 5 | 129.33 | 130.39 | 132.58 | 133.11 | 132.79 | 133.78 | | | |
| 6 | 129.94 | 132.15 | 131.61 | 131.81 | 133.50 | 134.90 | | | |
| 7 | 130.75 | 131.47 | 133.55 | 133.79 | 133.72 | | | | |
| 8 | 131.25 | 132.32 | 133.60 | 133.29 | 133.14 | | | | |
| 9 | 132.06 | 133.14 | 133.60 | 133.60 | | | | | |
| 10 | 132.46 | 133.21 | 132.82 | 133.44 | | | | | |
| 11 | 133.25 | 133.63 | 134.55 | | | | | | |
| 12 | 132.55 | 133.52 | 134.14 | | | | | | |
| 13 | 133.12 | 133.66 | | | | | | | |
| 14 | 133.79 | 133.96 | | | | | | | |
| 15 | 134.41 | | | | | | | | |
| 16 | 134.40 | | | | | | | | |

TABLE 6

Time table for finding the errata locator and evaluator polynomial using the inverse-free BM algorithm for a (255,239) RS code. Each entry is the time in mini-second needed for one block computation, which is averaged from 100 computations.

| s\t | 0 | 1 | 2 | 3 | 4 | 5 | 6 | 7 | 8 |
|---|---|---|---|---|---|---|---|---|---|
| 0 | 0.00 | 421.43 | 421.29 | 421.79 | 421.30 | 420.70 | 420.51 | 420.10 | 420.77 |
| 1 | 419.19 | 418.92 | 418.83 | 418.78 | 416.92 | 418.55 | 418.78 | 417.93 | |
| 2 | 416.37 | 417.31 | 416.30 | 416.00 | 416.40 | 416.29 | 416.56 | 415.86 | |
| 3 | 414.84 | 414.28 | 414.30 | 414.19 | 413.14 | 413.85 | 412.65 | | |
| 4 | 412.84 | 412.26 | 412.14 | 411.56 | 411.18 | 411.26 | 411.64 | | |
| 5 | 410.21 | 409.30 | 409.24 | 410.56 | 409.65 | 408.89 | | | |
| 6 | 408.00 | 407.58 | 407.52 | 407.47 | 407.97 | 407.03 | | | |
| 7 | 404.08 | 404.80 | 404.96 | 404.87 | 404.94 | | | | |
| 8 | 403.74 | 402.78 | 403.13 | 403.36 | 402.87 | | | | |
| 9 | 401.68 | 401.09 | 400.99 | 400.36 | | | | | |
| 10 | 398.97 | 398.73 | 398.54 | 398.33 | | | | | |
| 11 | 396.74 | 398.89 | 396.23 | | | | | | |
| 12 | 393.63 | 394.22 | 394.30 | | | | | | |
| 13 | 391.13 | 391.44 | | | | | | | |
| 14 | 389.85 | 388.56 | | | | | | | |
| 15 | 388.33 | | | | | | | | |
| 16 | 384.36 | | | | | | | | |

What is claimed is:

1. A method performed by a computer for correcting both errors and erasures, in transmitted data stored in a computer memory, using Reed-Solomon encoding by simultaneously computing; an errata locator polynomial and an errata evaluator polynomial using the step of iterating without performing division; without a separate computation of an erasure locator polynomial, and without a separate computation of a Forney syndrome polynomial.

2. The method of claim 1 wherein the step of iterating comprises using a general purpose computer to calculate the errata locator polynomial and the errata evaluator polynomial without computing an inverse in a finite field and without computing the discrepancies needed in a Berlekamp-Massey method.

3. The method of claim 1 wherein the step of iterating comprises using a computer to iterate according to a modified Berlekamp-Massey algorithm.

4. The method of claim 1 further comprising the steps of: using a computer to define a modified errata locator polynomial according to the equation:

$$\Lambda(x) = \sigma(x)\tau(x) = \prod_{j=1}^{s+v}(1+\hat{Z}_j x) = \sum_{j=0}^{s+v} \Lambda_j x^j; \text{ and} \quad (55)$$

using a computer to define a modified errata evaluator polynomial according to the equation:

$$\Omega(x) = x\sum_{i=1}^{s+v} \hat{W}_i \hat{Z}_i \prod_{l \ne i}(1+\hat{Z}_l x). \quad (56)$$

5. The method of claim 1 wherein the step of iterating comprises:

(a) using a computer to define:

$k=0$, $l=0$ $\Omega^{(a)}(x)=x^d$, $\Lambda^{(a)}(x)=0$ $\Omega^{(b)}(x)=\sigma(x)\cdot S(x) \bmod x^d$, and $\Lambda^{(b)}(x)=\sigma(x)$; (60)

(b) using a computer to set $k=k+1$;

(c) using a computer, for $k \le d-s-1$, to define $\Omega^{(b)}(x) \leftarrow x\Omega^{(b)}(x)$, $\Lambda^{(b)}(x) \leftarrow x\Lambda^{(b)}(x)$, (61)

$\delta=\Omega_d^{(b)}(x)$, $\gamma=\Omega_d^{(a)}$, (62)

$\Omega^{(c)}(x)=\delta\cdot\Omega^{(a)}(x)+\gamma\cdot\Omega^{(b)}(x)$, $\Lambda^{(c)}(x)=\delta\cdot\Lambda^{(a)}(x)+\gamma\cdot\Lambda^{(b)}(x)$, (63)

If $\delta \ne 0$ and $2l \le k-1$ then $\Omega^{(a)}(x)=\Omega^{(b)}(x)$, $\Lambda^{(a)}(x)=\Lambda^{(b)}(x)$ and $l=k-l$ (64)

$\Omega^{(b)}(x)=\Omega^{(c)}(x)$, $\Lambda^{(b)}(x)=\Lambda^{(c)}(x)$; and (65)

(d) repeating step (b and c) for $k \le d-s-1$.

6. The method of claim 1 wherein the step of iterating comprises:

(a) using a computer to define:

$k=0$, $l=0$, update=0, decode=0

$\Omega^{(a)}(x)=x^d$, $\Lambda^{(a)}(x)=0$ $\Omega^{(c)}(x)=S(x)$, $\Lambda^{(c)}(x)=1$ (b) using a computer to set decode=0, if $Z_k \ne 0$, otherwise, set decode=1;

(c) using a computer to set $\delta=1$, $\gamma=Z_k$, and $\Omega_d^{(c)}=0$, if decode=0, otherwise, set $\delta=\Omega_d^{(c)}$, $\gamma=\Omega_d^{(a)}$;

(d) using a computer to set update=1, and l=k-l, if $\delta \ne 0$ and $2l \le k-1$, otherwise, set update=0, and if decode=0 then set update=1.

(e) using a computer to define $\Omega\text{tmp}0=\delta\cdot\Omega^{(a)}(x)+\gamma\cdot\Omega^{(c)}(x)$, $\Omega\text{tmp}1=\Omega^{(c)}(x)$ $\Lambda\text{tmp}0=\delta\cdot\Lambda^{(a)}(x)+\gamma\cdot\Lambda^{(c)}(x)$, $\Lambda\text{tmp}1=\Lambda^{(c)}(x)$ (f) using a computer to set $\Omega\text{tmp}=\Omega\text{tmp}0$, and $\Lambda\text{tmp}=\Lambda\text{tmp}0$, if decode=0, otherwise, set $\Omega\text{tmp}=\Omega\text{tmp}1$, and set $\Lambda\text{tmp}=\Lambda\text{tmp}1$;

(g) using a computer to set $\Omega^{(a)}(x)=\Omega\text{tmp}$, $\Lambda^{(a)}(x)=\Lambda\text{tmp}$, if update=1;

(h) using a computer to define $\Omega^{(c)}(x)=x\cdot\Omega\text{tmp}0$, $\Lambda^{(c)}(x)=x\cdot\Lambda\text{tmp}0$;

(i) using a computer to set $\Omega_{d-1}^{(c)}=0$;

(j) using a computer to set k=k+1.; and (k) repeating steps (b)–(j) for k≦d−1.

7. A method performed by a dedicated circuit for correcting both errors and erasures, in transmitted data stored in a computer memory, using Reed-Solomon encoding by simultaneously computing an errata locator polynomial and an errata evaluator polynomial without performing polynomial division, without computing the discrepancies, without a separate computation of an erasure locator polynomial, and without a separate computation of a Forney syndrome polynomial $T(x)\equiv\alpha(x)S(x)\bmod x^d$.

8. The method of claim 7 wherein the step of iterating comprises:

(a) using a dedicated circuit to define:

$k=0, l=0,$ update=0, decode=0

$\Omega^{(a)}(x)=x^d, \Lambda^{(a)}(x)=0$ $\Omega^{(c)}(x)=S(x), \Lambda^{(c)}(x)=1$ (b) using a dedicated circuit to set decode=0, if $Z_k\neq 0$, otherwise, set decode=1;

(c) using a dedicated circuit to set $\delta=1, \gamma=Z_k$, and $\Omega_d^{(c)}=0$, if decode=0, otherwise, set $\delta=\Omega_d^{(c)}, \gamma=\Omega_d^{(a)}$;

(d) using a dedicated circuit to set update=1, and l=k−l, if $\delta\neq 0$ and 2l≦k−1, otherwise, set update=0, and if decode=0 then set update=1;

(e) using a dedicated circuit to compute $\Omega tmp0=\delta\cdot\Omega^{(a)}(x)+\gamma\cdot\Omega^{(c)}(x), \Omega tmp1=\Omega^{(c)}(x)$ $\Lambda tmp0=\delta\cdot\Lambda^{(a)}(x)+\gamma\cdot\Lambda^{(c)}(x), \Lambda tmp1=\Lambda^{(c)}(x)$ (f) using a dedicated circuit to set $\Omega tmp=\Omega tmp0$, and $\Lambda tmp=\Lambda tmp0$, if decode=0, otherwise, set $\Omega tmp=\Omega tmp1$, and set $\Lambda tmp=\Lambda tmp1$;

(g) using a dedicated circuit to set $\Omega^{(a)}(x)=\Omega tmp, \Lambda^{(a)}(x)=\Lambda tmp$, if update=1;

(h) using a dedicated circuit to compute $\Omega^{(c)}(x)=x\cdot\Omega tmp0, \Lambda^{(c)}(x)=x\cdot\Lambda tmp0;$ (i) using a dedicated circuit to set $\Omega_{d+1}^{(c)}=0$;

(j) using a dedicated circuit to set k=k+1.; and (k) using a dedicated circuit to repeat steps (b)–(j) for k≦d−1.

9. The method of claim 8 wherein all the steps (a)–(k) use the same dedicated circuit.

10. The method of claim 8 wherein the steps (a)–(k) use a plurality of dedicated circuits.

11. An electronic circuit for correcting both errors and erasures, in transmitted data stored in a computer memory, using Reed-Solomon encoding comprising:

means for simultaneously computing an errata locator polynomial and an errata evaluator polynomial without performing polynomial division, without computing an inverse in a finite field, without computing the discrepancies, without a separate computation of an erasure locator polynomial, and without a separate computation of a Forney syndrome polynomial; and means for generating corrected data responsive to the errata locator polynomial and the errata evaluator polynomial.

12. The electronic circuit of claim 11 wherein the means for simultaneously computing comprises:

a syndrome computation unit for generating syndromes responsive to a received vector;

means for calculating erasure locations responsive to an erasure location indicator;

means for decoding the syndromes and the erasure locations for generating a erasure location polynomial and a Forney syndrome polynomial;

means for calculating the errata locator polynomial and the errata evaluator polynomial from the generated erasure location polynomial and Forney syndrome polynomial;

means for Chien searching and evaluating magnitudes of the errata locator polynomial and the errata evaluator polynomial to generate an errata vector; and means for calculating a corrected codeword responsive to the received vector and the errata vector.

13. The electronic circuit of claim 12 wherein the means for decoding comprises;

(a) a circuit to define:

$k=0, l=0,$ update=0, decode=0

$\Omega^{(a)}(x)=x^d, \Lambda^{(a)}(x)=0$ $\Omega^{(c)}(x)=S(x), \Lambda^{(c)}(x)=1$ (b) a circuit to set decode=0, if $Z_k\neq 0$, otherwise, set decode=1;

(c) a circuit to set $\delta=1, \gamma=Z_k$, and $\Omega_d^{(c)}=0$, if decode=0, otherwise, set $\delta=\Omega_d^{(c)}, \gamma=\Omega_d^{(a)}$;

(d) a circuit to set update=1, and l=k−l, if $\delta\neq 0$ and 2l≦k−1, otherwise, set update=0, and if decode=0 then set update=1;

(e) a circuit to calculate $\Omega tmp0=\delta\cdot\Omega^{(a)}(x)+\gamma\cdot\Omega^{(c)}(x), \Omega tmp1=\Omega^{(c)}(x)$ $\Lambda tmp0=\delta\cdot\Lambda^{(a)}(x)+\gamma\cdot\Lambda^{(c)}(x), \Lambda tmp1=\Lambda^{(c)}(x)$ (f) a circuit to set $\Omega tmp=\Omega tmp0$, and $\Lambda tmp=\Lambda tmp0$, if decode=0, otherwise, set $\Omega tmp=\Omega tmp1$, and set $\Lambda tmp=\Lambda tmp1$;

(g) a circuit to set $\Omega^{(a)}(x)=\Omega tmp, \Lambda^{(a)}(x)=\Lambda tmp$, if update=1;

(h) a circuit to compute $\Omega^{(c)}(x)=x\cdot\Omega tmp0, \Lambda^{(c)}(x)=x\cdot\Lambda tmp0;$ (i) a circuit to set $\Omega_{d+1}^{(c)}=0$;

(j) a circuit to set k=k+1.; and (k) a circuit to repeat steps (b)–(j) for k≦d−1.

14. The electronic circuit of claim 13 wherein the circuit in step (e) to calculate $\Omega tmp0=\delta\cdot\Omega^{(a)}(x)+\gamma\cdot\Omega^{(c)}(x), \Omega tmp1=\Omega^{(c)}(x)$ $\Lambda tmp0=\delta\cdot\Lambda^{(a)}(x)+\gamma\cdot\Lambda^{(c)}(x), \Lambda tmp1=\Lambda^{(c)}(x)$ comprises;

a dedicated circuit to calculate $\delta\cdot\Omega^{(a)}(x)$;

a dedicated circuit to calculate $\gamma\cdot\Omega^{(c)}(x)$;

a dedicated circuit to calculate $\delta\cdot\Lambda^{(a)}(x)$; and a dedicated circuit to calculate $\gamma\cdot\Lambda^{(c)}(x)$.

15. The electronic circuit of claim 14 wherein the dedicated circuit to calculate $\delta\cdot\Omega^{(a)}(x)$ wherein, $$d = \left(\sum_{j=0}^{7} a_j H^j\right)\delta = A \cdot \delta,$$

$a=[a_7, a_6, \ldots, a_0]$ is the coafficients of $\Omega^{(a)}(x)$, and $\delta$ is in the vector form as $\delta=[\delta_7, \delta_6, \ldots, \delta_0]$ and $H^0$ is the 8×8 identity matrix, the electronic circuit comprises:

a circuit to define:

$$A = \begin{bmatrix} a_6+a_5+a_4+a_0 & a_7+a_6+a_5+a_1 & a_7+a_6+a_2 & a_7+a_3 & a_4 & a_5 & a_6 & a_7 \\ a_5+a_4+a_3 & a_6+a_5+a_4+a_0 & a_7+a_6+a_5+a_1 & a_7+a_6+a_2 & a_7+a_3 & a_4 & a_5 & a_6 \\ a_4+a_3+a_2 & a_5+a_4+a_3 & a_6+a_5+a_4+a_0 & a_7+a_6+a_5+a_1 & a_7+a_6+a_2 & a_7+a_3 & a_4 & a_5 \\ a_7+a_3+a_2+a_1 & a_4+a_3+a_2 & a_5+a_4+a_3 & a_6+a_5+a_4+a_0 & a_7+a_6+a_5+a_1 & a_7+a_6+a_2 & a_7+a_3 & a_4 \\ a_5+a_4+a_2+a_1 & a_6+a_5+a_3+a_2 & a_7+a_6+a_4+a_3 & a_7+a_5+a_4 & a_6+a_5+a_0 & a_7+a_6+a_1 & a_7+a_2 & a_3 \\ a_6+a_5+a_3+a_1 & a_7+a_6+a_4+a_2 & a_7+a_5+a_3 & a_6+a_4 & a_7+a_5 & a_6+a_0 & a_7+a_1 & a_2 \\ a_7+a_6+a_2 & a_7+a_3 & a_4 & a_5 & a_6 & a_7 & a_0 & a_1 \\ a_7+a_6+a_5+a_1 & a_7+a_6+a_2 & a_7+a_3 & a_4 & a_5 & a_6 & a_7 & a_0 \end{bmatrix}; \quad (71)$$

and a combinational logic circuit to calculate: $d = A \cdot \delta$.

\* \* \* \* \*

UNITED STATES PATENT AND TRADEMARK OFFICE
CERTIFICATE OF CORRECTION

PATENT NO. : 6,449,746 B1
DATED : September 10, 2002
INVENTOR(S) : Trieu K. Truong, Jyh H. Jeng and Tsen C. Cheng It is certified that error appears in the above-identified patent and that said Letters Patent is hereby corrected as shown below:

Title page,
Item [56], References Cited, OTHER PUBLICATIONS, in "Truong, T.K., et al., 'Inversionless decoding ...,'" replace "erasures or Reed" with -- erasures of Reed --.

Column 29,
Line 63, replace "k=k+1" with -- $k=k+1$ --.

Line 67, replace "$\delta = \Omega_d^{(b)}(x), \gamma = \Omega_d^{(a)},$" with -- $\delta = \Omega_d^{(b)}, \gamma = \Omega_d^{(a)},$ --.

Column 30,
Lines 49-50, replace "l=k-1,if $\delta \neq 0$ and $2l \leq k - 1$," with -- $\ell = k - \ell$, if $\delta \neq 0$ and $2\ell \leq k - 1$, --.
Line 62, replace "$\Omega^{(a)}(x) = \Omega tmp, \Lambda^{(a)}(x) = \Lambda tmp$" with -- $\Omega^{(a)}(x) = \Omega tmp, \Lambda^{(a)}(x) = \Lambda tmp$ --.

Column 31,
Line 1, replace "$\Omega_{d-1}^{(c)} = 0$" with -- $\Omega_{d+1}^{(c)} = 0$ --.

Lines 2 and 45, replace "k=k+1" with -- $k=k+1$ --.
Lines 3 and 47, replace "k ≤ d-1" with -- $k \leq d-1$ --.
Line 12, replace "T(x) ≡ a (x)S(x) mod $x^d$" with -- $T(x) \equiv a(x)S(x) \mod x^d$ --.
Lines 26-27, replace "l=k-1,if $\delta \neq 0$ and $2l \leq k - 1$," with -- $\ell = k - \ell$, if $\delta \neq 0$ and $2\ell \leq k - 1$, --.
Lines 37-38, replace "$\Omega^{(a)}(x) = \Omega tmp, \Lambda^{(a)}(x) = \Lambda tmp$" with -- $\Omega^{(a)}(x) = \Omega tmp, \Lambda^{(a)}(x) = \Lambda tmp$ --.

Column 32,
Line 4, replace "a erasure" with -- an erasure --.
Lines 31-32, "l=k-1,if $\delta \neq 0$ and $2l \leq k - 1$," with -- $\ell = k - \ell$, if $\delta \neq 0$ and $2\ell \leq k - 1$, --.
Line 44, replace "$\Omega^{(a)}(x) = \Omega tmp, \Lambda^{(a)}(x) = \Lambda tmp$" with -- $\Omega^{(a)}(x) = \Omega tmp, \Lambda^{(a)}(x) = \Lambda tmp$ --.
Line 52, replace "k=k+1" with -- $k=k+1$ --.
Line 53, replace "k≤d-1" with -- $k \leq d-1$ --.
Line 62, replace "$\delta \cdot \Omega^{(a)}(x)$" with -- $\delta \cdot \Omega^{(a)}(x)$ --.
Line 63, replace "$\gamma \cdot \Omega^{(c)}(x)$" with -- $\gamma \cdot \Omega^{(c)}(x)$ --.
Line 64, replace "$\delta \cdot \Lambda^{(a)}(x)$" with -- $\delta \cdot \Lambda^{(a)}(x)$ --.
Line 65, replace "$\gamma \cdot \Lambda^{(c)}(x)$" with -- $\gamma \cdot \Lambda^{(c)}(x)$ --.
Line 67, replace "$\delta \cdot \Omega^{(a)}(x)$" with -- $\delta \cdot \Omega^{(a)}(x)$ --.

UNITED STATES PATENT AND TRADEMARK OFFICE
CERTIFICATE OF CORRECTION

PATENT NO. : 6,449,746 B1
DATED : September 10, 2002
INVENTOR(S) : Trieu K. Truong, Jyh H. Jeng and Tsen C. Cheng It is certified that error appears in the above-identified patent and that said Letters Patent is hereby corrected as shown below:

Column 34,
Line 1, replace "coafficients" with -- coefficients --.
Line 21, replace "d=A.$\delta$" with -- $d = A.\delta$ --.

Signed and Sealed this

Twenty-ninth Day of April, 2003

JAMES E. ROGAN
*Director of the United States Patent and Trademark Office*